United States Patent
Herle

(10) Patent No.: US 10,770,705 B2
(45) Date of Patent: Sep. 8, 2020

(54) OLEFIN SEPARATOR FREE LI-ION BATTERY

(71) Applicant: Applied Materials, Inc., Santa Clara, CA (US)

(72) Inventor: Subramanya P. Herle, Mountain View, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 63 days.

(21) Appl. No.: 16/037,895

(22) Filed: Jul. 17, 2018

(65) Prior Publication Data

US 2019/0058177 A1 Feb. 21, 2019

Related U.S. Application Data

(60) Provisional application No. 62/546,824, filed on Aug. 17, 2017.

(51) Int. Cl.
*H01M 2/16* (2006.01)
*H01M 2/14* (2006.01)
(Continued)

(52) U.S. Cl.
CPC ....... *H01M 2/1646* (2013.01); *C23C 14/0021* (2013.01); *C23C 14/081* (2013.01);
(Continued)

(58) Field of Classification Search
None
See application file for complete search history.

(56) References Cited

U.S. PATENT DOCUMENTS 4,180,400 A * 12/1979 Smith .................. B23B 27/148
419/17
5,208,121 A 5/1993 Yahnke et al.
(Continued)

FOREIGN PATENT DOCUMENTS

EP 0761726 A2 3/1997
EP 1345280 A1 9/2003
(Continued)

OTHER PUBLICATIONS

Choi, et al., "Enhancement of Thermal Stability and Cycling Performance in Lithium-Ion Cells through the Use of Ceramic-Coated Separators," Journal of Power Sources 195 (2010), 5 pages.
(Continued)

*Primary Examiner* — Scott J. Chmielecki
(74) *Attorney, Agent, or Firm* — Patterson + Sheridan LLP

(57) ABSTRACT

Implementations of the present disclosure generally relate to separators, high performance electrochemical devices, such as, batteries and capacitors, including the aforementioned separators, and methods for fabricating the same. In one implementation, a method of forming a separator for a battery is provided. The method comprises exposing a metallic material to be deposited on a surface of an electrode structure positioned in a processing region to an evaporation process. The method further comprises flowing a reactive gas into the processing region. The method further comprises reacting the reactive gas and the evaporated metallic material to deposit a ceramic separator layer on the surface of the electrode structure.

20 Claims, 9 Drawing Sheets

(51) Int. Cl.
| | |
|---|---|
| *H01M 10/058* | (2010.01) |
| *H01M 10/0525* | (2010.01) |
| *H01G 9/04* | (2006.01) |
| *C23C 14/28* | (2006.01) |
| *H01G 9/02* | (2006.01) |
| *H01G 9/00* | (2006.01) |
| *C23C 14/08* | (2006.01) |
| *C23C 14/24* | (2006.01) |
| *H01G 11/84* | (2013.01) |
| *C23C 14/00* | (2006.01) |
| *H01M 10/0585* | (2010.01) |
| *H01G 11/52* | (2013.01) |
| *H01G 11/56* | (2013.01) |

(52) U.S. Cl.
CPC .............. *C23C 14/24* (2013.01); *C23C 14/28* (2013.01); *H01G 9/0029* (2013.01); *H01G 9/02* (2013.01); *H01G 9/04* (2013.01); *H01G 11/52* (2013.01); *H01G 11/84* (2013.01); *H01M 2/145* (2013.01); *H01M 2/1673* (2013.01); *H01M 10/058* (2013.01); *H01M 10/0525* (2013.01); *H01M 10/0585* (2013.01); *H01G 11/56* (2013.01)

(56) References Cited

U.S. PATENT DOCUMENTS

| | | | |
|---|---|---|---|
| 5,342,709 | A | 8/1994 | Yahnke et al. |
| 5,656,391 | A | 8/1997 | Hambitzer et al. |
| 5,705,292 | A | 1/1998 | Yukita et al. |
| 5,948,464 | A | 9/1999 | Delnick |
| 5,961,672 | A | 10/1999 | Skotheim et al. |
| 6,153,337 | A | 11/2000 | Carlson et al. |
| 6,183,901 | B1 | 2/2001 | Ying et al. |
| 6,194,098 | B1 | 2/2001 | Ying et al. |
| 6,277,514 | B1 | 8/2001 | Ying et al. |
| 6,306,545 | B1 | 10/2001 | Carlson et al. |
| 6,432,586 | B1 | 8/2002 | Zhang |
| 7,662,510 | B2 | 2/2010 | Zhang |
| 7,666,233 | B2 | 2/2010 | Visco et al. |
| 7,754,015 | B2 | 7/2010 | Sasaki et al. |
| 7,928,411 | B2 | 4/2011 | Klemm et al. |
| 8,017,262 | B2 | 9/2011 | Fujikawa et al. |
| 8,142,920 | B2 | 3/2012 | Hennige et al. |
| 8,182,948 | B2 | 5/2012 | He et al. |
| 8,202,649 | B2 | 6/2012 | Visco et al. |
| 8,372,475 | B2 | 2/2013 | Kim et al. |
| 8,394,535 | B2 | 3/2013 | Kobori et al. |
| 8,394,536 | B2 | 3/2013 | Kobori et al. |
| 8,425,738 | B2 | 4/2013 | Hoffman et al. |
| 8,470,468 | B2 | 6/2013 | Xiao et al. |
| 8,518,582 | B2 | 8/2013 | Park et al. |
| 8,535,826 | B2 | 9/2013 | Jeong et al. |
| 8,591,223 | B2 | 11/2013 | Hein et al. |
| 8,597,819 | B2 | 12/2013 | Hennige et al. |
| 8,663,730 | B1 | 3/2014 | Lahiri et al. |
| 8,691,419 | B2 | 4/2014 | Lee et al. |
| 9,065,122 | B2 | 6/2015 | Orilall et al. |
| 9,142,833 | B2 | 9/2015 | Tolbert et al. |
| 9,508,976 | B2 | 11/2016 | Herle |
| 9,548,486 | B2 | 1/2017 | Abe et al. |
| 9,660,310 | B2 | 5/2017 | Mak et al. |
| 2003/0146674 | A1* | 8/2003 | Jacot .................. H03H 9/02897 310/313 R |
| 2007/0281206 | A1 | 12/2007 | Fujikawa et al. |
| 2009/0110807 | A1 | 4/2009 | Koenig |
| 2009/0203222 | A1* | 8/2009 | Dussarrat ................ C07F 17/00 438/778 |
| 2010/0099018 | A1* | 4/2010 | Kawase ............ H01M 10/0568 429/105 |
| 2010/0216026 | A1 | 8/2010 | Lopatin et al. |
| 2011/0262660 | A1* | 10/2011 | Ishii ...................... C23C 16/305 427/569 |
| 2012/0251890 | A1 | 10/2012 | Pascaly et al. |
| 2012/0301774 | A1 | 11/2012 | Jiang et al. |
| 2013/0216924 | A1* | 8/2013 | Hillhouse ........... H01M 16/003 429/408 |
| 2013/0260184 | A1 | 10/2013 | Yu et al. |
| 2013/0260208 | A1 | 10/2013 | Cho et al. |
| 2013/0337312 | A1 | 12/2013 | Park et al. |
| 2014/0045033 | A1 | 2/2014 | Zhang et al. |
| 2014/0072884 | A1 | 3/2014 | Zhang et al. |
| 2014/0133068 | A1 | 5/2014 | Iwai et al. |
| 2014/0212727 | A1 | 7/2014 | Hying et al. |
| 2014/0220233 | A1* | 8/2014 | Huang .................. H01M 2/145 427/58 |
| 2014/0227443 | A1 | 8/2014 | Hoffmann et al. |
| 2014/0227455 | A1 | 8/2014 | Hoffmann et al. |
| 2014/0272524 | A1 | 9/2014 | Visco et al. |
| 2014/0322587 | A1 | 10/2014 | Lai et al. |
| 2014/0335395 | A1 | 11/2014 | Ramasubramanian et al. |
| 2015/0064576 | A1 | 3/2015 | Aitken et al. |
| 2015/0132633 | A1 | 5/2015 | Joshi |
| 2015/0140404 | A1 | 5/2015 | Yoo et al. |
| 2015/0236320 | A1 | 8/2015 | Laramie et al. |
| 2015/0236322 | A1 | 8/2015 | Laramie et al. |
| 2015/0325828 | A1 | 11/2015 | Herle et al. |
| 2016/0204408 | A1* | 7/2016 | Herle .................... H01M 4/661 429/143 |
| 2016/0365610 | A1* | 12/2016 | Fujii ................. H01M 10/4235 |
| 2017/0012264 | A1* | 1/2017 | Carlson ............... H01M 10/052 |
| 2017/0025658 | A1 | 1/2017 | Shi et al. |
| 2017/0062788 | A1 | 3/2017 | Herle |
| 2017/0338456 | A1* | 11/2017 | Suguro ............. H01M 10/4235 |

FOREIGN PATENT DOCUMENTS

| | | |
|---|---|---|
| KR | 20150026553 A | 3/2015 |
| WO | 2012050406 A2 | 4/2012 |
| WO | 2014093519 A1 | 6/2014 |
| WO | 2016-020737 A1 | 2/2016 |

OTHER PUBLICATIONS

Evonik Industries, "Growth Drivers in Our Portfolio: Lithium-ion Battery Components," Jun. 2009, 4 pp.
International Search Report and Written Opinion for International Application No. PCT/US2016/034579 dated Aug. 24, 2016.
Kim, et al., "Surface-Modified Membrane as a Separator for Lithium-Ion Polymer Battery," Energies, 2010, 3, pp. 866-885.
Lee, et al., "A Review of Recent Developments in Membrane Separators for Rechargeable Lithium-Ion Batteries," Royal Society of Chemistry, Energy and Environmental Science, Aug. 18, 2014, 30 pp.
Lee, et al., "Effect of Al2O3 Coatings Prepared by RF Sputtering on Polyethylene Separators for High-Power Lithium on Batteries," Macromolecular Research, 2014, vol. 22, No. 11, pp. 1190-1195.
Novak, et al., "Study of Surface Properties of Polyolefins Modified by Corona Discharge Plasma," Plasma Processes and Polymers, 2006, 3, pp. 355-364.
Office Action for U.S. Appl. No. 14/937,442 dated Mar. 10, 2016.
Shin, et al., "Composite Gel Electrolytes for Suppressing Lithium Dendrite Growlh and Improving Cycling Performance of LiNi0.5Mn1.504 Electrodes," Journal of The Electrochemical Society, 162 (14), 2015, pp. A2628-A2634.
Struller, et al., "Aluminum Oxide Barrier Layers on Polymer Web," 2012, 12 pages.
Suo, et al., "A New Class of Solvent-in-Salt Electrolyte for High-Energy Rechargeable Metallic Lithium Batteries," Nature Communications, Feb. 12, 2013, 9 pp.
Yoo, et al., "Initiated Chemical Vapor Deposition {iCVD) of Highly Cross-Linked Polymer Films for Advanced Lithiumon Battery Separators," ACS Applied Materials & Interfaces 2015, 7, pp. 18849-18855.
Zhang, "A Review on the Separators of Liquid Electrolyle Li-Ion Batteries," Journal of Power Sources, 164 (2007) pp. 351-364.
Zhang, et al., "Superior Conductive Solid-like Electrolytes: Nanoconfining Liquids Within the Hollow Structures," Nano cetters, 2015, 15 (5) Apr. 6, 2015, 5 pages.

(56) References Cited

OTHER PUBLICATIONS

International Search Report and Written Opinion for International Application No. PCT/US2018/042403 dated Jul. 17, 2018.

* cited by examiner

OLEFIN SEPARATOR FREE LI-ION BATTERY

CROSS-REFERENCE TO RELATED APPLICATIONS

This application claims benefit of U.S. Provisional Patent Application Ser. No. 62/546,824, filed Aug. 17, 2017, which is incorporated herein by reference in its entirety.

BACKGROUND

Field

Implementations of the present disclosure generally relate to separators, high performance electrochemical devices, such as, batteries and capacitors, including the aforementioned separators, and methods for fabricating the same.

Description of the Related Art

Fast-charging, high-capacity energy storage devices, such as capacitors and lithium-ion (Li-ion) batteries, are used in a growing number of applications, including portable electronics, medical, transportation, grid-connected large energy storage, renewable energy storage, and uninterruptible power supply (UPS).

Li-ion batteries typically include an anode electrode, a cathode electrode, and a separator positioned between the anode electrode and the cathode electrode. The separator is an electronic insulator, which provides physical and electrical separation between the cathode and the anode electrodes. The separator is typically made from micro-porous polyethylene and polyolefin. During electrochemical reactions, i.e., charging and discharging, Li-ions are transported through the pores in the separator between the two electrodes via an electrolyte. Thus, high porosity is desirable to increase ionic conductivity. However, some high porosity separators are susceptible to electrical shorts when lithium dendrites formed during cycling create shorts between the electrodes.

Currently, battery cell manufacturers purchase separators, which are then laminated together with anode and cathode electrodes in separate processes. Other separators are typically made by wet or dry extrusion of a polymer and then stretched to produce holes (tears) in the polymer. The separator is also one of the most expensive components in the Li-ion battery and accounts for over 20% of the material cost in battery cells.

For most energy storage applications, the charge time and capacity of energy storage devices are significant parameters. In addition, the size, weight, and/or expense of such energy storage devices can be significant limitations. The use of currently available separators has a number of drawbacks. Namely, such available materials limit the minimum size of the electrodes constructed from such materials, suffer from electrical shorts, involve complex manufacturing methods, and expensive materials. Further, current separator designs often suffer from Lithium dendrite growth, which may lead to short-circuits.

Accordingly, there is a need in the art for faster charging, higher capacity energy storage devices with separators that are smaller, lighter, and can be more cost effectively manufactured.

SUMMARY

Implementations of the present disclosure generally relate to separators, high performance electrochemical devices, such as, batteries and capacitors, including the aforementioned separators, and methods for fabricating the same. In one implementation, a method of forming a separator for a battery is provided. The method comprises exposing a metallic material to be deposited on a surface of an electrode structure positioned in a processing region to an evaporation process. The method further comprises flowing a reactive gas into the processing region. The method further comprises reacting the reactive gas and the evaporated metallic material to deposit a ceramic separator layer on the surface of the electrode structure.

In another implementation, a method of forming a battery is provided. The method comprises depositing a ceramic separator layer on a surface of a positive electrode structure. The ceramic separator layer is deposited on the surface of the positive electrode structure by exposing a metallic material to be deposited on the surface of the positive electrode structure to an evaporation process, flowing a reactive gas into the processing region, and reacting the reactive gas and the evaporated metallic material to deposit the ceramic separator layer. The positive electrode structure is joined with a negative electrode with the ceramic separator layer therebetween.

In yet another implementation, a method of forming a battery is provided. The method comprises depositing a ceramic separator layer on a surface of a negative electrode structure. The ceramic separator layer is deposited on the surface of the negative electrode structure by exposing a metallic material to be deposited on the surface of the negative electrode structure to an evaporation process, flowing a reactive gas into the processing region, and reacting the reactive gas and the evaporated metallic material to deposit the ceramic separator layer on the negative electrode structure. The negative electrode structure is joined with a positive electrode with the ceramic separator layer therebetween.

In yet another implementation, a method of forming a battery is provided. The method comprises depositing a first ceramic separator layer on the surface of a positive electrode structure. The ceramic separator layer is deposited on the surface of the positive electrode structure by exposing a metallic material to be deposited on the surface of the positive electrode structure to an evaporation process, flowing a reactive gas into the processing region, and reacting the reactive gas and the evaporated metallic material to deposit the ceramic separator layer. The method further comprises depositing a second ceramic separator layer on the surface of a negative electrode structure. The second ceramic separator layer is deposited on the surface of the negative electrode structure by exposing a metallic material to be deposited on the surface of the negative electrode structure to an evaporation process, flowing a reactive gas into the processing region, and reacting the reactive gas and the evaporated metallic material to deposit the second ceramic separator layer on the negative electrode structure. The positive electrode and the negative electrode are joined together to form the battery.

In yet another implementation, a method of forming a separator for a battery is provided. The method comprises exposing a metallic material to be deposited on a surface of an electrode structure positioned in a processing region to an evaporation process. The method further comprises flowing a reactive gas into the processing region. The method further comprises reacting the reactive gas and the evaporated metallic material to deposit a ceramic separator layer on the surface of the electrode structure. Flowing the reactive gas into the processing region comprises flowing moist oxygen into the processing region.

In yet another implementation, a method of forming a battery is provided. The method comprises depositing a ceramic separator layer on a surface of a negative electrode structure. Depositing the ceramic separator layer further comprises exposing a metallic material to be deposited on the surface of the negative electrode structure positioned in a processing region to an evaporation process. Depositing the ceramic separator layer further comprises flowing a reactive gas into the processing region. Depositing the ceramic separator layer further comprises reacting the reactive gas and the evaporated metallic material to deposit the ceramic separator layer on the surface of the negative electrode structure, wherein flowing a reactive gas into the processing region comprises flowing moist oxygen into the processing region. The method further comprises joining the negative electrode structure with a positive electrode structure with the ceramic separator layer therebetween.

In yet another implementation, a method of forming a battery is provided. The method comprises depositing a ceramic separator layer on a surface of a positive electrode structure. Depositing the ceramic separator layer comprises exposing a metallic material to be deposited on the surface of the positive electrode structure positioned in a processing region to an evaporation process. Depositing the ceramic separator layer further comprises flowing a reactive gas into the processing region. Depositing the ceramic separator layer further comprises reacting the reactive gas and the evaporated metallic material to deposit the ceramic separator layer on the surface of the positive electrode structure. Flowing the reactive gas into the processing region comprises flowing moist oxygen into the processing region. The method further comprises joining the positive electrode structure with a negative electrode structure with the ceramic separator layer therebetween.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1:
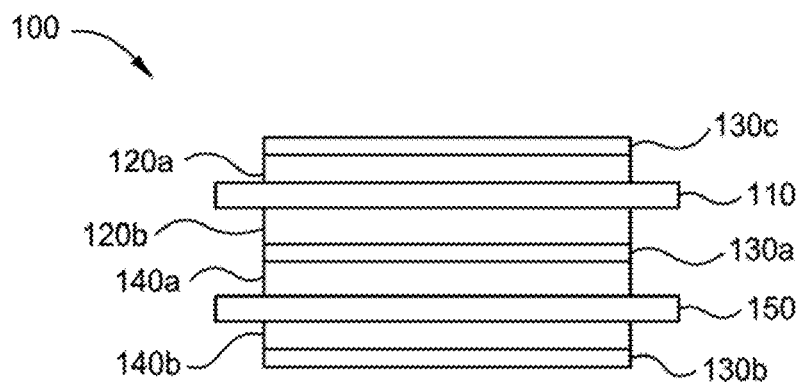
FIG. 1 illustrates a cross-sectional view of one implementation of a cell structure formed according to one or more implementations described herein.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The following disclosure describes separators, high performance electrochemical cells and batteries including the aforementioned separators, and methods for fabricating the same. Certain details are set forth in the following description and in FIGS. 1-11 to provide a thorough understanding of various implementations of the disclosure. Other details describing well-known structures and systems often associated with electrochemical cells and batteries are not set forth in the following disclosure to avoid unnecessarily obscuring the description of the various implementations.

Many of the details, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

Implementations described herein will be described below in reference to a high rate evaporation process that can be carried out using a roll-to-roll coating system, such as TopMet™, SmartWeb™, TopBeam™ all of which are available from Applied Materials, Inc. of Santa Clara, Calif. Other tools capable of performing high rate evaporation processes may also be adapted to benefit from the implementations described herein. In addition, any system enabling high rate evaporation processes described herein can be used to advantage. The apparatus description described herein is illustrative and should not be construed or interpreted as limiting the scope of the implementations described herein. It should also be understood that although described as a roll-to-roll process, the implementations described herein may be performed on discrete polymer substrates.

The term "about" generally indicates within ±0.5%, 1%, 2%, 5%, or up to ±10% of the indicated value. For example, a pore size of about 10 nm generally indicates in its broadest sense 10 nm±10%, which indicates 9.0-11.0 nm. In addition, the term "about" can indicate either a measurement error (i.e., by limitations in the measurement method), or alternatively, a variation or average in a physical characteristic of a group (e.g., a population of pores).

The term "crucible" as used herein shall be understood as a unit capable of evaporating material that is fed to the crucible when the crucible is heated. In other words, a crucible is defined as a unit adapted for transforming solid material into vapor. Within the present disclosure, the term "crucible" and "evaporation unit" are used synonymously.

The currently available generation batteries, especially Li-ion batteries, use porous polyolefin separators, which are susceptible to thermal shrinkage at elevated temperatures and may cause short between positive and negative electrodes or the corresponding current collectors. In addition, some polyolefin separators have poor wettability issues. A ceramic coating on the separator helps to inhibit direct contact between electrodes and helps to prevent potential dendrite growth associated with Li metal. Current state of the art ceramic coating uses wet coating (e.g., slot-die techniques) of ceramic particles dispersed in a polymeric binder to make the composite and a solvent to make the slurry. The coating thickness is typically around 3 microns including randomly oriented dielectric material bound together by a polymer leading to a random pore structure. The existing ceramic particle coating method has difficulty in reducing tortuosity due to this random orientation of ceramic particles. Further, it is difficult to reduce the thickness of current ceramic coatings using current wet coating techniques. In order to compensate for the increased surface area of finer ceramic powder particles current wet coating techniques involve increased amounts of both binder and solvent to decrease the viscosity of the slurry. Thus, the current wet coating techniques suffer from several problems.

From a manufacturing point of view, an in-situ deposition of a ceramic coating with a dry method is preferred from both a cost and performance point of view. In the present disclosure, a thin, low ionic resistance ceramic coating is formed directly on a surface of a positive electrode and/or a surface of a negative electrode, where the ceramic coating is formed by a dry method using reactive evaporation of metals or metal compounds. Further, the ceramic coating can be tuned for the appropriate thickness, micro/nanostructure, multilayered structure, morphology, pore structure and pore/ceramic orientation.

Compared to conventional ceramic coated separators, the reactive evaporation techniques described herein have at least one of the following advantages: (1) thinner separators result in less inactive component volume fraction and a corresponding increase in energy density and less ionic resistance across the separator; (2) the control of coating thickness and morphology provides less tortuous pores leading to superior separator performance; (3) the pore surface of the ceramic enhances the ionic conductivity of the overall electrolyte; and (4) suitably engineered ceramic coated separator shall enhance X-ray detection to determine manufacturing defects; and (5) higher voltage stability and puncture resistance properties of the separator can be achieved by nanocomposite coating control. Lithium dendrite inhibiting properties of ceramic-coated separator are enhanced by nanosurface engineering to achieve homogeneous lithium metal deposition and stripping during cycling.

Results achieved so far include (1) uniform 300 nanometer and 600 nanometer thick $AlO_x$ coating deposited on a positive electrode using aluminum evaporation in a reactive oxygen environment; (2) the $AlO_x$ coating adhesion seems to be good with scotch tape peeling tests; and (3) columnar $AlO_x$ structure and crystallites are aligned vertically in the ceramic separator layer.

FIG. 1 illustrates a cross-sectional view of one implementation of a cell structure 100 formed according to implementations described herein. The cell structure 100 has one or more ceramic separator layer(s) 130 formed according to implementations described herein. In some implementations, the cell structure 100 is a Li-ion battery structure. Cell structure 100 has a positive current collector 110, positive electrode(s) 120a, 120b (collectively 120) formed on opposing sides of the positive current collector 110, one or more ceramic separator layer(s) 130a-c (collectively 130), a negative current collector 150 and negative electrode(s) 140a, 140b (collectively 140) formed on opposing sides of the negative current collector. Note in FIG. 1 that the current collectors are shown to extend beyond the stack, although it is not necessary for the current collectors to extend beyond the stack, the portions extending beyond the stack may be used as tabs. In addition, although dual-sided electrode structures are shown, the implementations described herein are also applicable to single-sided electrode structures.

The current collectors 110, 150, on positive electrode 120 and negative electrode 140, respectively, can be identical or different electronic conductors. Examples of metals that the current collectors 110, 150 may be comprised of include aluminum (Al), copper (Cu), zinc (Zn), nickel (Ni), cobalt (Co), tin (Sn), silicon (Si), manganese (Mn), magnesium (Mg), alloys thereof, and combinations thereof. In one implementation, at least one of the current collectors 110, 150 is perforated. Furthermore, current collectors may be of any form factor (e.g., metallic foil, sheet, or plate), shape and micro/macro structure. Generally, in prismatic cells, tabs are formed of the same material as the current collector and may be formed during fabrication of the stack, or added later. All components except current collectors 110 and 150 contain lithium ion electrolytes.

The negative electrode 140 or anode may be any material compatible with the positive electrode 120. The negative electrode 140 may have an energy capacity greater than or equal to 372 mAh/g, preferably ≥700 mAh/g, and most preferably ≥1000 mAh/g. The negative electrode 140 may be constructed from a graphite, silicon-containing graphite (e.g., silicon (<5%) blended graphite), a lithium metal foil or a lithium alloy foil (e.g. lithium aluminum alloys), or a mixture of a lithium metal and/or lithium alloy and materials such as carbon (e.g. coke, graphite), nickel, copper, tin, indium, silicon, oxides thereof, or combinations thereof. The negative electrode 140 comprises intercalation compounds containing lithium or insertion compounds containing lithium.

The positive electrode 120 or cathode may be any material compatible with the negative electrode 140 and may include an intercalation compound, an insertion compound, or an electrochemically active polymer. Suitable intercalation materials include, for example, lithium-containing metal oxides, $MoS_2$, $FeS_2$, $MnO_2$, $TiS_2$, $NbSe_3$, $LiCoO_2$, $LiNiO_2$, $LiMnO_2$, $LiMn_2O_4$, $V_6O_{13}$ and $V_2O_5$. Suitable polymers include, for example, polyacetylene, polypyrrole, polyaniline, and polythiophene. The positive electrode 120 or cathode may be made from a layered oxide, such as lithium cobalt oxide, an olivine, such as lithium iron phosphate, or a spinel, such as lithium manganese oxide. Exemplary lithium-containing oxides may be layered, such as lithium cobalt oxide ($LiCoO_2$), or mixed metal oxides, such as $LiNi_xCo_{1-2x}MnO_2$, $LiNiMnCoO_2$ ("NMC"), $LiNi_{0.5}Mn_{1.5}O_4$, $Li(Ni_{0.8}Co_{0.15}Al_{0.05})O_2$, $LiMn_2O_4$, and doped lithium rich layered-layered materials, wherein x is zero or a non-zero number. Exemplary phosphates may be iron olivine ($LiFePO_4$) and it is variants (such as $LiFe_{(1-x)}Mg_xPO_4$), $LiMoPO_4$, $LiCoPO_4$, $LiNiPO_4$, $Li_3V_2(PO_4)_3$, $LiVOPO_4$, $LiMP_2O_7$, or $LiFe_{1.5}P_2O_7$, wherein x is zero or a non-zero number. Exemplary fluorophosphates may be $LiVPO_4F$, $LiAlPO_4F$, $Li_5V(PO_4)_2F_2$, $Li_5Cr(PO_4)_2F_2$, $Li_2CoPO_4F$, or $Li_2NiPO_4F$. Exemplary silicates may be $Li_2FeSiO_4$, $Li_2MnSiO_4$, or $Li_2VOSiO_4$. An exemplary non-lithium compound is $Na_5V_2(PO_4)_2F_3$.

In some implementations, the positive electrode 120 is formed from positive electrode particles. In some implementations, the positive electrode particles are coated to enhance higher voltage stability, interface compatibility with the electrolyte and longer battery cycle life. The coating of the positive electrode particles may be performed by sol-gel techniques, dry coating of nano-particles on the positive electrode material, or atomic layer deposition (ALD) techniques.

In some implementations of a lithium ion cell according to the present disclosure, lithium is contained in atomic layers of crystal structures of carbon graphite ($LiC_6$) at the negative electrode 140 and lithium manganese oxide ($LiMnO_4$) or lithium cobalt oxide ($LiCoO_2$) at the positive electrode 120, for example, although in some implementations the negative electrode 140 may also include lithium absorbing materials such as silicon, tin, etc. The cell, even though shown as a planar structure, may also be formed into a cylinder by rolling the stack of layers; furthermore, other cell configurations (e.g., prismatic cells, button cells) may be formed.

Electrolytes infused in cell components 120, 130 and 140 can be comprised of a liquid/gel or a solid polymer and may be different in each. In some implementations, the electrolyte primarily includes a salt and a medium (e.g., in a liquid electrolyte, the medium may be referred to as a solvent; in a gel electrolyte, the medium may be a polymer matrix). The salt may be a lithium salt. The lithium salt may include, for example, $LiPF_6$, $LiAsF_6$, $LiCF_3SO_3$, $LiN(CF_3SO_3)_3$, $LiBF_6$, and $LiClO_4$, BETTE electrolyte (commercially available from 3M Corp. of Minneapolis, Minn.) and combinations thereof. Solvents may include, for example, ethylene carbonate (EC), propylene carbonate (PC), EC/PC, 2-MeTHF (2-methyltetrahydrofuran)/EC/PC, EC/DMC (dimethyl carbonate), EC/DME (dimethyl ethane), EC/DEC (diethyl carbonate), EC/EMC (ethyl methyl carbonate), EC/EMC/DMC/DEC, EC/EMC/DMC/DEC/PE, PC/DME, and DME/PC. Polymer matrices may include, for example, PVDF (polyvinylidene fluoride), PVDF:THF (PVDF:tetrahydrofuran), PVDF:CTFE (PVDF: chlorotrifluoroethylene) PAN (polyacrylonitrile), and PEO (polyethylene oxide).

In some implementations, the ceramic separator layer 130 comprises a porous (e.g., microporous) ceramic layer (e.g., a separator film) 130 with pores. In some implementations, the ceramic separator layer 130 is non-porous. In some implementations, the ceramic separator layer 130 comprises a lithium-ion conducting material. The lithium-ion conducting material may be a lithium-ion conducting ceramic or a lithium-ion conducting glass or liquid crystal. In some implementations, the ceramic separator layer 130 does not need to be ion conducting, however, once filled with electrolyte (liquid, gel, solid, combination etc.), the combination of porous ceramic and electrolyte is ion conducting. The ceramic separator layer 130 is, at least, adapted for preventing electronic shorting (e.g. direct or physical contact of the anode and the cathode) and blocking dendrite growth. The ceramic separator layer 130 may be, at least, adapted for blocking (or shutting down) ionic conductivity (or flow) between the anode and the cathode during the event of thermal runaway. The ceramic separator layer 130 should be sufficiently conductive to allow ionic flow between the anode and cathode, so that current, in selected quantities, may be generated by the cell. The ceramic separator layer 130 should adhere well to the underlying electrode material, i.e. separation should not occur. As discussed herein, the ceramic separator layer 130 is formed on the underlying electrode using evaporation techniques.

The ceramic separator layer 130 comprises one or more ceramic materials. The ceramic material may be an oxide. The ceramic material may be selected from, for example, aluminum oxide ($Al_2O_3$), $AlO_x$, $AlO_xN_y$, AlN (aluminum deposited in a nitrogen environment), aluminum hydroxide oxide ((AlO(OH)) (e.g., diaspore (($\alpha$-AlO(OH))), boehmite ($\gamma$-AlO(OH)), or akdalaite ($5Al_2O_3.H_2O$)), calcium carbonate ($CaCO_3$), titanium dioxide ($TiO_2$), $SiS_2$, $SiPO_4$, silicon oxide ($SiO_2$), zirconium oxide ($ZrO_2$), MgO, $TiO_2$, $Ta_2O_5$, $Nb_2O_5$, $LiAlO_2$, $BaTiO_3$, BN, ion-conducting garnet, ion-conducting perovskite, ion-conducting anti-perovskites, porous glass ceramic, and the like, or combinations thereof. In one implementation, the ceramic material is a material selected from the group consisting of: porous aluminum oxide, porous-$ZrO_2$, porous-$SiO_2$, porous-MgO, porous-$TiO_2$, porous-$Ta_2O_5$, porous-$Nb_2O_5$, porous-$LiAlO_2$, porous-$BaTiO_3$, ion-conducting garnet, anti-ion-conducting perovskites, porous glass dielectric, or combinations thereof. The ceramic separator layer 130 is a binder-free ceramic layer. In some implementations, the ceramic separator layer 130 is a porous aluminum oxide layer.

In some implementations, the ceramic separator layer 130 may be a lithium-ion conducting material. The lithium-ion conducting material may be a lithium-ion conducting ceramic or a lithium-ion conducting glass or ion conducting liquid crystal. The Li-ion conducting material may be comprised of one or more of LiPON, doped variants of either crystalline or amorphous phases of $Li_7La_3Zr_2O_{12}$, doped anti-perovskite compositions, $Li_2S$—$P_2S_5$, $Li_{10}GeP_2S_{12}$, and $Li_3PS_4$, lithium phosphate glasses, sulfide glasses, (1−x)LiI-(x)$Li_4SnS_4$, xLiI-(1−x)$Li_4SnS_4$, mixed sulfide and oxide electrolytes (crystalline LLZO, amorphous (1−x)LiI-(x)$Li_4SnS_4$ mixture, and amorphous (x)LiI-(1−x)$Li_4SnS_4$ for example. In one implementation, x is between 0 and 1 (e.g., 0.1, 0.2, 0.3, 0.4, 0.5, 0.6, 0.7, 0.8, and 0.9). The Li-ion conducting material can be directly deposited on the lithium metal film using either a by Physical Vapor Deposition (PVD), Chemical Vapor Deposition (CVD), spray, doctor blade, printing or any of a number of coating methods. A suitable method for some implementations is PVD. In some implementations, the ceramic separator layer 130 does not need to be ion conducting, however, once filled with electrolyte (liquid, gel, solid, combination etc.), the combination of porous substrate and electrolyte is ion conducting.

In one implementation, the ceramic separator layer 130 is the lithium-ion conducting material and the lithium-ion conducting material is selected from the group consisting of: LiPON, crystalline or amorphous phases of garnet-type $Li_7La_3Zr_2O_{12}$, LISICON (e.g., $Li_{2+2x}Zn_{1-x}GeO_4$ wherein $0<x<1$), NASICON (e.g., $Na_{1-x}Zr_2Si_xP_{3-x}O_{12}$ wherein $0<x<3$), lithium borohydride ($LiBH_4$), doped anti-perovskite compositions, lithium containing sulfides (e.g., $Li_2S$, $Li_2S$—$P_2S_5$, $Li_{10}GeP_2S_{12}$ and $Li_3PS_4$), and lithium argyrodites (e.g., $LiPS_5X$ wherein x is Cl, Br or I).

In some implementations, the ceramic separator layer 130 comprises from about 50 wt. % to about 100 wt. % of aluminum oxide based on the total weight of the ceramic separator layer 130 (e.g., from about 75 wt. % to about 100 wt. %; from about 85 wt. % to about 100 wt. % of aluminum oxide).

In some implementations, the ceramic material is blended with glass evaporated in an oxidizing atmosphere. For example, $SiO_2$ can be introduced into $Al_2O_3$ to modify the physical properties (such as flexibility, fracture toughness) of the ceramic layer.

In some implementations, the ceramic separator layer 130 comprises a plurality of ceramic columnar projections. The ceramic columnar shaped projections may have a diameter that expands from the bottom (e.g., where the columnar shaped projection contacts the porous substrate) of the columnar shaped projection to a top of the columnar shaped projection. The ceramic columnar projections typically comprise dielectric grains. Nano-structured contours or channels are typically formed between the dielectric grains.

In some implementations, the plurality of ceramic columnar projections may comprise one or more of various forms of porosities. In some implementations, the columnar projections of the ceramic separator layer 130 form a nano-porous structure between the columnar projections of dielectric material. In one implementation, the nano-porous structure may have a plurality of nano-pores that are sized to have an average pore size or diameter less than about 10 nanometers (e.g., from about 1 nanometer to about 10 nanometers; from about 3 nanometers to about 5 nanometers). In another implementation, the nano-porous structure may have a plurality of nano-pores sized to have an average pore size or diameter less than about 5 nanometers. In one implementation, the nano-porous structure has a plurality of nano-pores having a diameter ranging from about 1 nanometer to about 20 nanometers (e.g., from about 2 nanometers to about 15 nanometers; or from about 5 nanometers to about 10 nanometers). The nano-porous structure yields a significant increase in the surface area of the ceramic separator layer 130. The pores of the nanoporous structure can act as liquid electrolyte reservoir and provides excess surface area for ion-conductivity. Not to be bound by theory but it is believed that the electrolyte liquid/gel confined within the nanoporous structure behaves similar to solid electrolyte.

In some implementations, the ceramic separator layer 130 has a porosity of at least 10%, 15%, 20%, 25%, 30%, 35%, 40%, 45%, 50%, 55%, 60%, or 65% as compared to a solid film formed from the same material and a porosity up to at least 15%, 20%, 25%, 30%, 35%, 40%, 45%, 50%, 55%, 60%, 65%, or 70% as compared to a solid film formed from the same material.

Porosity is typically used since it is easy to estimate. However, tortuosity is the direct measure for describing a lithium diffusion pathway. Tortuosity describes the tortuous path for Li diffusion in porous media. For example, if diffusion is along a straight pathway, the tortuosity equals 1. Tortuosity is not easily measured due to the complex geometry in dielectric layers (i.e., irregular particle shapes, wide particle size distribution, etc.). It is believed that direct engineering tortuosity, i.e., introducing "straight" pathway or channels, is desirable. Ceramic layers formed using the evaporation processes disclosed herein exhibit lower tortuosity when compared with ceramic layers formed using currently know slot-die techniques or other slurry deposition techniques.

The ceramic separator layer 130 may be a coating or a discrete layer, either having a thickness in the range of 1 nanometer to 3,000 nanometers (e.g., in the range of 10 nanometers to 600 nanometers; in the range of 50 nanometers to 200 nanometers; in the range of 100 nanometers to 150 nanometers).

Figure 2:
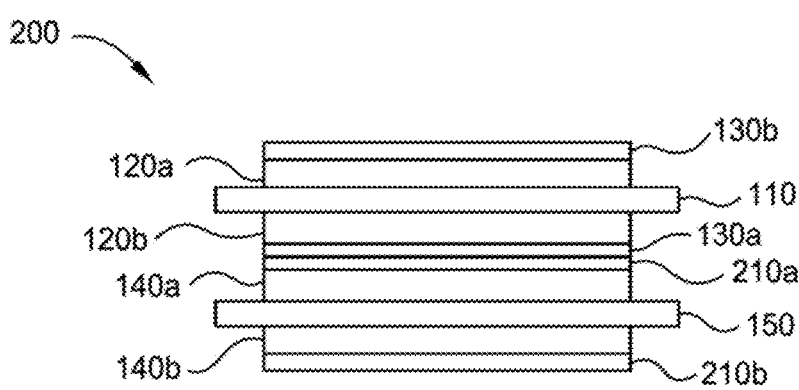
FIG. 2 illustrates a cross-sectional view of another implementation of a cell structure formed according to one or more implementations described herein.

FIG. 2 illustrates a cross-sectional view of another implementation of a cell structure 200 formed according to implementations described herein. In some implementations, the cell structure 200 is a Li-ion battery structure. Similar to cell structure 100, the cell structure 200 has the ceramic separator layer 130 formed according to implementations described herein. However, in addition the ceramic separator layer 130, the cell structure 200 also comprises one or more gel polymer layers 210*a*, 210*b* (collectively 210) positioned between the ceramic separator layer 130 and the opposing electrode structure, which in this implementation is the negative electrode 140*a*. Although shown as contacting the positive electrode 120*b*, it should be understood that in some implementations, the ceramic separator layer 130*a* contacts the negative electrode 140*a* and the gel polymer layer 210*a* contacts the negative electrode 140*a*. Not to be bound by theory, but it is believe that the gel polymer layer helps improve adhesion between the positive electrode and the negative electrode when joined together.

The polymer for the gel polymer layer 210 can be chosen from polymers currently used in the Li-ion battery industry. Examples of polymers that may be used to form the gel polymer layer include, but are not limited to, polyvinylidene difluoride (PVDF), polyethylene oxide (PEO), poly-acrylonitrile (PAN), carboxymethyl cellulose (CMC), styrene butadiene rubber (SBR), and combinations thereof. Not to be bound by theory but it is believed that the gel polymer layer 210 can take-up Li-conducting electrolyte to form gel during device fabrication which is beneficial for forming good solid electrolyte interface (SEI) and also helps lower resistance. In some implementations, gel electrolyte or liquid crystal electrolyte is made by using mixture of warm liquids and lithium ion conducting salt. The mixture of warm liquids is injected into the spiral-wound electrodes or stacked electrodes filling the network electrode pores and the electrolyte forms a solid or gel at room temperature. The gel polymer layer 210 can be formed by dip-coating, slot-die coating, gravure coating, or printing. The polymer can also be deposited using Applied Materials Metacoat equipment. The dielectric polymer layer may have a thickness from about 5 nanometers to about 1 micrometer. Organic polymers with sulfur ions (e.g., polyphenylene sulfide with $Li_2O$ mixture) have shown good results for lithium metal based anodes and in some cases form liquid crystal electrolyte.

Figure 3:
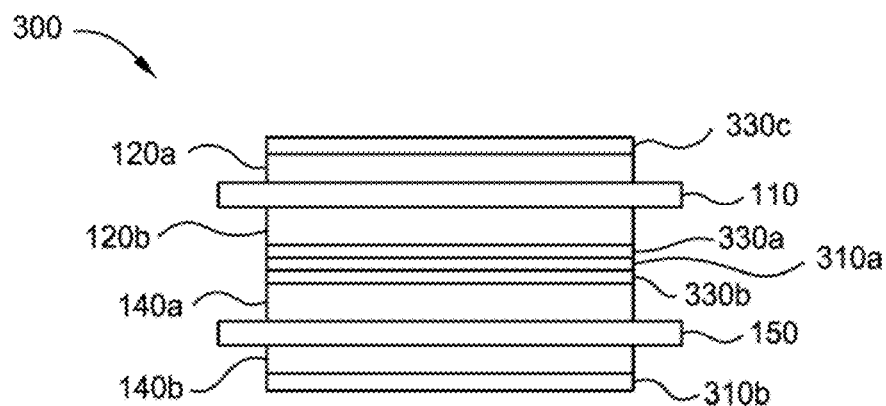
FIG. 3 illustrates a cross-sectional view of yet another implementation of a cell structure formed according to one or more implementations described herein.

FIG. 3 illustrates a cross-sectional view of another implementation of a cell structure 300 formed according to implementations described herein. In some implementations, the cell structure 300 is a Li-ion battery structure. Similar to cell structure 200, the cell structure 300 has one or more ceramic separator layers 330*a-c* (collectively 330) and one or more gel polymer layers 310*a*, 310*b* (collectively 310) formed according to implementations described herein. The one or more ceramic separator layers 330 are similar to the one or more ceramic separator layers 130. The one or more gel polymer layers 310 are similar to the one or more gel polymer layers 210. However, the gel polymer layer 310*a* is positioned between or "sandwiched" in between the ceramic separator layer 330*a* and the ceramic separator layer 330*b*.

Figure 4:
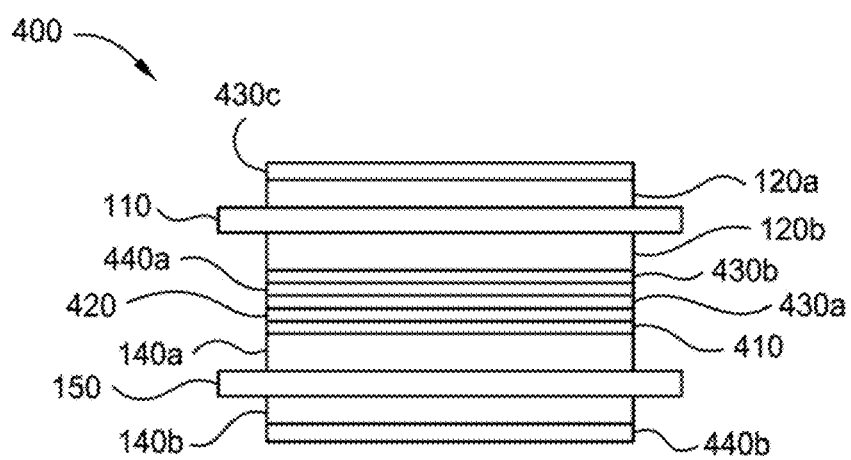
FIG. 4 illustrates a cross-sectional view of yet another implementation of a cell structure formed according to one or more implementations described herein.

FIG. 4 illustrates a cross-sectional view of yet another implementation of a cell structure 400 formed according to one or more implementations described herein. In some implementations, the cell structure 400 is a Li-ion battery structure. Similar to cell structure 300, the cell structure 400 has one or more ceramic separator layers 430a-c (collectively 430) and one or more gel polymer layers 440a, 440b (collectively 440) formed according to implementations described herein. The one or more ceramic separator layers 430 are similar to the one or more ceramic separator layer(s) 130. The one or more gel polymer layers 440a, 440b (collectively 440) are similar to the one or more gel polymer layers 210. However, the gel polymer layer 440a is positioned between or "sandwiched" in between the ceramic separator layer 430a and the ceramic separator layer 430b. The cell structure 400 optionally includes a pre-lithiation layer 410, and a protective film 420 formed between a ceramic separator layer 430 and the pre-lithiation layer 410. Thus, instead of depositing the ceramic separator layer directly on the negative electrode as depicted in FIGS. 1-3, the ceramic separator layer 430 is deposited directly on either the protective film 420 (if present) or the pre-lithiation layer 410 if the protective film 420 is not present.

In some implementations, the pre-lithiation layer 410 formed on the negative electrode 140a is a lithium metal film. The lithium metal film may be formed according to the implementations described herein. In some implementations, the negative electrode 140a is a silicon graphite anode or a silicon oxide graphite anode with the lithium metal film formed thereon. The lithium metal film replenishes lithium lost from first cycle capacity loss of the negative electrode 140a. The lithium metal film may be a thin lithium metal film (e.g., 20 microns or less; from about 1 micron to about 20 microns; or from about 2 microns to about 10 microns). In some implementations where the lithium metal film functions as the negative electrode, the lithium metal film replaces the negative electrode 140. In some implementations where the lithium metal film functions as the negative electrode the lithium metal film is formed on the negative current collector 150.

In some implementations, a protective film 420 is formed on the lithium metal film. The protective film 420 is typically formed ex-situ on the lithium metal film. The protective film 420 is electrically insulating yet sufficiently conductive to lithium-ions. In one implementation, the protective film 420 is a nonporous film. In another implementation, the protective film 420 is a porous film. In one implementation, the protective film 420 has a plurality of nanopores that are sized to have an average pore size or diameter less than about 10 nanometers (e.g., from about 1 nanometer to about 10 nanometers; from about 3 nanometers to about 5 nanometers). In another implementation, the protective film 420 has a plurality of nanopores that are sized to have an average pore size or diameter less than about 5 nanometers. In one implementation, the protective film 420 has a plurality of nanopores having a diameter ranging from about 1 nanometer to about 20 nanometers (e.g., from about 2 nanometers to about 15 nanometers; or from about 5 nanometers to about 10 nanometers).

The protective film 420 may be a coating or a discrete layer, either having a thickness in the range of 1 nanometer to 200 nanometers (e.g., in the range of 5 nanometers to 200 nanometers; in the range of 10 nanometers to 50 nanometers). Not to be bound by theory, but it is believed that protective films greater than 200 nanometers may increase resistance within the rechargeable battery.

Examples of materials that may be used to form the protective film 420 include, but are not limited to, lithium fluoride (LiF), aluminum oxide, lithium carbonate ($Li_2CO_3$), and combinations thereof. In one implementation, the protective film 420 is a lithium fluoride film. Not to be bound by theory but it is believed that the protective film 420 can take-up Li-conducting electrolyte to form gel during device fabrication which is beneficial for forming good solid electrolyte interface (SEI) and also helps lower resistance. The protective film 420 can be directly deposited on the lithium metal film by Physical Vapor Deposition (PVD), such as evaporation or sputtering, special atomic layer deposition (ALD), a slot-die process, a thin-film transfer process, or a three-dimensional lithium printing process. PVD is a preferred method for deposition of the protective film 420. The protective film 420 can also be deposited using Metacoat equipment.

The ceramic separator layer 430a may be deposited directly on either the protective film 420 (if present) or the pre-lithiation layer 410 if the protective film 420 is not present. The ceramic separator layer 430a may be a lithium-ion conducting material. The lithium-ion conducting material may be a lithium-ion conducting ceramic or a lithium-ion conducting glass. The Li-ion conducting material may be comprised of one or more of LiPON, doped variants of either crystalline or amorphous phases of $Li_7La_3Zr_2O_{12}$, doped anti-perovskite compositions, $Li_2S$—$P_2S_5$, $Li_{10}GeP_2S_{12}$, and $Li_3PS_4$, lithium phosphate glasses, (1−x)LiI-(x)$Li_4SnS_4$, xLiI-(1−x)$Li_4SnS_4$, mixed sulfide and oxide electrolytes (crystalline LLZO, amorphous (1−x)LiI-(x)$Li_4SnS_4$ mixture, and amorphous xLiI-(1−x)$Li_4SnS_4$) for example. In one implementation, x is between 0 and 1 (e.g., 0.1, 0.2, 0.3, 0.4, 0.5, 0.6, 0.7, 0.8, and 0.9). The Li-ion conducting material can be directly deposited on the pre-lithiation layer 410 or the protective film 420 using either a by Physical Vapor Deposition (PVD), Chemical Vapor Deposition (CVD), spray, doctor blade, printing or any of a number of coating methods. A suitable method for some implementations is PVD. In some implementations, the ceramic separator layer 430a does not need to be ion conducting, however, once filled with electrolyte (liquid, gel, solid, combination etc.), the combination of porous substrate and electrolyte is ion conducting.

In one implementation, the ceramic separator layer 430a is the lithium-ion conducting material and the lithium-ion conducting material is selected from the group consisting of: LiPON, crystalline or amorphous phases of garnet-type $Li_7La_3Zr_2O_{12}$, LISICON (e.g., $Li_{2+2x}Zn_{1-x}GeO_4$ wherein 0<x<1), NASICON (e.g., $Na_{1+x}Zr_2Si_xP_{3-x}O_{12}$ wherein 0<x<3), lithium borohydride ($LiBH_4$), doped anti-perovskite compositions, lithium containing sulfides (e.g., $Li_2S$, $Li_2S$—$P_2S_5$, $Li_{10}GeP_2S_{12}$ and $Li_3PS_4$), and lithium argyrodites (e.g., $LiPS_5X$ wherein x is Cl, Br or I).

In some implementations, the ceramic separator layer 430a formed over the negative electrode 140 and the ceramic separator layer 430b formed over the positive electrode 120 are different materials. For example, in one implementation, ceramic separator layer 430a is a non-porous lithium ion conducting material and the ceramic separator layer 430b is a porous lithium ion conducting material.

In some implementations, the ceramic separator layer 430 is a non-porous ion conducting electrolyte layer, which may provide added electrochemical stability for some anode material compositions. For example, in one implementation, the negative electrode 140 is a silicon or silicon oxide blended graphite anode material with the pre-lithiation layer 410 (e.g., lithium metal film) formed thereon, a protective film 420 that is a lithium fluoride film, and the ceramic separator layer 430 is a non-porous lithium ion-conducting material.

In some implementations, prior to method 500 (see FIG. 5), method 600 (see FIG. 6) or method 700 (see FIG. 7), the surfaces of the electrode (e.g., negative electrode and/or positive electrode) are optionally exposed to a surface modification treatment to enhance the nucleation/growth conditions of the surfaces of the electrode. In some implementations, the surface modification treatment process is a plasma treatment process (e.g., corona discharge treatment process). The surface modification treatment process includes supplying a treatment gas mixture into a processing region. A plasma is then formed from the treatment gas mixture to plasma treat a surface of the electrode to activate at least a portion of the electrode into an excited state, forming a treated electrode having a treated upper surface, which may then enhance the nucleation/growth conditions of the subsequently deposited ceramic separator layer.

In one implementation, the treatment gas mixture includes at least one of oxygen-containing gas, an inert gas (e.g., argon, helium), or combinations thereof. In one implementation, the oxygen-containing gas supplied into the processing region includes at least one of oxygen ($O_2$), ozone ($O_3$), oxygen radicals (O*), ionized oxygen atoms, carbon dioxide ($CO_2$), nitric oxide ($NO_x$), water vapor, or combinations thereof. Other oxygen-containing gases may be used.

According to one implementation of the present disclosure involving oxidation, a gas source supplies oxygen gas ($O_2$) through a mass flow controller to an ozonator, which converts a large fraction of the oxygen to ozone gas ($O_3$). The resultant oxygen-based mixture of $O_2$ and $O_3$ and perhaps some oxygen radicals O* and ionized oxygen atoms or molecules is delivered into the processing region. The oxygen-based gas reacts within the processing region with the surface of the electrode, which has been heated to a predetermined, preferably low temperature. Ozone is a metastable molecule which spontaneously quickly dissociates in the reaction $O_3 \rightarrow O_2 + O^*$, where O* is a radical, which very quickly reacts with whatever available material can be oxidized. The ozonator may be implemented in a number of forms including capacitively or inductively coupled plasma or a UV lamp source.

At these high ozone concentrations, the electrode need not be heated very much to achieve relatively high oxidation rates. The high ozone concentration also allows the ozone partial pressure to be reduced. The high ozone fraction allows the ozone oxidation to be performed at pressures of less than 20 Torr. It should be understood that the aforementioned surface modification technique is exemplary and other surface modifications techniques that achieve the selected surface modification may be used. For example, in some implementations, this preparation may include exposing the electrode to a corona treatment, chemically treating it (e.g. with an oxidizing agent), or adsorbing or grafting a polyelectrolyte to the surface of the electrode. Having a charged electrode may be appropriate for a first layer of oppositely charged material to bind to the electrode.

In some implementations, the surface modification treatment process is an electron beam treatment process. An electron beam source is directed onto a surface of the electrode prior to coating the electrode. The electron beam source may be a linear source. The electron beam device emitting the electron beam is typically adapted such that the electron beam affects the electrode across its entire width, such that due to the longitudinal movement of the electrode, the whole surface (on one side) of the electrode is treated with the electron beam. The electron beam device may for example be an electron source such as an electron flood gun, a linear electron gun, an electron beam, or the like. The gas used in the electron source may be Argon, $O_2$, $N_2$, $CO_2$, or He, more particularly $O_2$, $N_2$, $CO_2$, or He.

The electrode treated with the emitted electrons is physically, respectively structurally altered in order to achieve improved adhesion between the electrode and the subsequently deposited ceramic separator layer. The selected effect can be achieved by providing electrons at energies from 1 keV to 15 keV, more typically from 5 keV to 10 keV, for example, 6 keV, 7 keV, 8 keV or 9 keV. Typical electron currents are from 20 mA to 1500 mA, for example 500 mA.

In some implementations prior to method 500 (see FIG. 5), method 600 (see FIG. 6), method 700 (see FIG. 7), or method 800 (see FIG. 8), the surfaces of the electrode (e.g., negative electrode and/or positive electrode) is optionally exposed to a cooling process. In one implementation, the surfaces of the electrode structure may be cooled to a temperature between −20 degrees Celsius and room temperature (i.e., 20 to 22 degrees Celsius) (e.g., −10 degrees Celsius and 0 degrees Celsius). In some implementations, the electrode structure may be cooled by cooling the drum over which the electrode structure travels. Other active cooling means may be used to cool the electrode structure. During the evaporation process, the electrode structure may be exposed to temperatures in excess of 1,000 degrees Celsius thus it is beneficial to cool the electrode structure prior to the evaporation processes of operation 510, operation 610, and operation 710.

Figure 5:
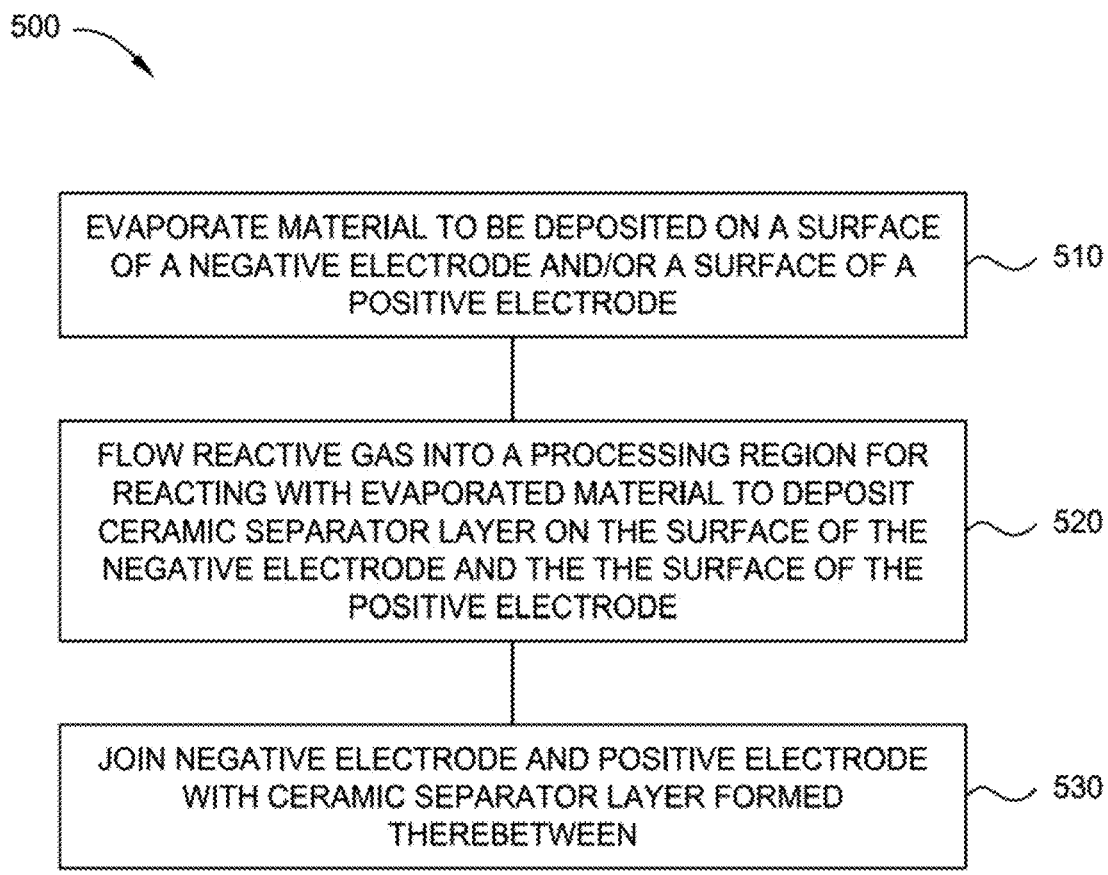
FIG. 5 illustrates a process flow chart summarizing one implementation of a method for forming a cell structure according to one or more implementations described herein.

FIG. 5 illustrates a process flow chart summarizing one implementation of a method 500 for forming a cell structure according to one or more implementations described herein. The cell structure may be, for example, the cell structure 100 depicted in FIG. 1.

At operation 510, the material to be deposited on at least one of a surface of a negative electrode and a surface of a positive electrode is exposed to an evaporation process to evaporate the material to be deposited in a processing region. In some implementations, the negative electrode is negative electrode 140 and the positive electrode is positive electrode 120. In some implementations, the material to be deposited is deposited on a single electrode (e.g., either the negative electrode or the positive electrode). In some implementations, the material to be deposited is deposited on both the negative electrode and the positive electrode. In some implementations, deposition on the negative electrode and the positive electrode may occur in the same processing chamber or may occur in separate processing chambers. In some implementations, deposition on the negative electrode and the positive electrode may occur sequentially or simultaneously.

The evaporation material may be chosen from the group consisting of aluminum (Al), zirconium (Zr), hafnium (Hf), niobium (Nb), tantalum (Ta), titanium (Ti), yttrium (Y), lanthanum (La), silicon (Si), boron (B), silver (Ag), chromium (Cr), copper (Cu), indium (In), iron (Fe), magnesium (Mg), calcium (Ca), strontium (Sr), barium (Ba), nickel (Ni), tin (Sn), ytterbium (Yb), lithium (Li), calcium (Ca) or combinations thereof. Typically, the material to be deposited is a metal such as aluminum or an aluminum alloy. Further, the evaporation material may also be an alloy of two or more metals. The evaporation material is the material that is evaporated during the evaporation process and with which the surface(s) of the one or more electrodes are coated. The material to be deposited (e.g., aluminum) can be provided in a crucible. The aluminum can, for example, be evaporated by thermal evaporation techniques or by electron beam evaporation techniques.

In some implementations, the evaporation material is fed to the crucible as a wire. In this case, the feeding rates and/or the wire diameters have to be chosen such that the appropriate ratio of the evaporation material and the reactive gas is achieved. In some implementations, the diameter of the feeding wire for feeding to the crucible is chosen between 0.5 mm and 2.0 mm (e.g., between 1.0 mm and 1.5 mm). These dimensions may refer to several feedings wires made of the evaporation material. Typical feeding rates of the wire are in the range of between 50 cm/min and 150 cm/min (e.g., between 70 cm/min and 100 cm/min).

The crucible is heated in order to generate a vapor, which reacts with the reactive gas supplied at operation 510 to coat the surface(s) of the one or more electrodes with a ceramic separator layer (e.g., ceramic separator layer 130). Typically, the crucible is heated by applying a voltage to the electrodes of the crucible, which are positioned at opposite sides of the crucible. Generally, according to implementations described herein, the material of the crucible is conductive. Typically, the material used as crucible material is temperature resistant to the temperatures used for melting and evaporating. Typically, the crucible of the present disclosure is made of one or more materials selected from the group consisting of: metallic boride, metallic nitride, metallic carbide, non-metallic boride, non-metallic nitride, non-metallic carbide, nitrides, titanium nitride, borides, graphite, $TiB_2$, BN, $B_4C$, and SiC.

The material to be deposited is melted and evaporated by heating the evaporation crucible. Heating can be conducted by providing a power source (not shown) connected to the first electrical connection and the second electrical connection of the crucible. For instance, these electrical connections may be electrodes made of copper or an alloy thereof. Thus, heating is conducted by the current flowing through the body of the crucible. According to other implementations, heating may also be conducted by an irradiation heater of an evaporation apparatus or an inductive heating unit of an evaporation apparatus.

The evaporation unit according to the present disclosure is typically heatable to a temperature of between 1,300 degrees Celsius and 1,600 degrees Celsius, such as 1,560 degrees Celsius. This is done by adjusting the current through the crucible accordingly, or by adjusting the irradiation accordingly. Typically, the crucible material is chosen such that its stability is not negatively affected by temperatures of that range. Typically, the speed of the one or more electrodes is in the range of between 20 cm/min and 200 cm/min, more typically between 80 cm/min and 120 cm/min such as 100 cm/min. In these cases, the means for transporting should be capable of transporting the substrate at those speeds.

At operation 520, a reactive gas is flowed into the processing region for reacting with the evaporated material to form a ceramic separator layer on at least a surface of the negative electrode and a surface of the positive electrode. According to typical implementations, which can be combined with other implementations described herein, the reactive gases can be selected from the group consisting of: oxygen-containing gases, nitrogen-containing gases, or combinations thereof. Exemplary oxygen-containing gases that may be used with the implementations described herein include oxygen ($O_2$), ozone ($O_3$), oxygen radicals (O*), ionized oxygen atoms, carbon dioxide ($CO_2$), nitric oxide ($NO_x$), water vapor, or combinations thereof. Exemplary nitrogen containing gases that may be used with the implementations described herein include $N_2$, $N_2O$, $NO_2$, $NH_3$, or combinations thereof. According to yet further implementations, additional gases, typically inert gases such as argon can be added to a gas mixture comprising the reactive gas. Thereby, typically the amount of reactive gas can be more easily controlled. According to typical implementations, which can be combined with other implementations described herein, the process can be carried out in a vacuum environment with a typical atmosphere of $1*10^{-2}$ mbar to $1*10^{-6}$ mbar (e.g., $1*10^{-3}$ mbar or below; $1*10^{-4}$ mbar or below).

At operation 520, in some implementations, moist oxygen may be used as the reactive gas. The moist oxygen may be formed by flowing oxygen through a canister containing water vapor to react with the evaporated material to form an aluminum hydroxide oxide ((AlO(OH)), which is deposited on the surface of the electrode. The aluminum hydroxide oxide ((AlO(OH)) typically takes the form of diaspore (($\alpha$-AlO(OH))), boehmite (Y-AlO(OH)), or akdalaite ($5Al_2O_3.H_2O$). Not to be bound by theory but not only is the aluminum hydroxide oxide thermodynamically stable but the hydrogen bond also helps improve the bond strength of the ceramic separator layer to the surface of the electrode.

In some implementations, during operation 520, a plasma is formed from the reactive gas mixture. In some implementations, the plasma is an oxygen-containing plasma. The oxygen-containing plasma reacts with the evaporated material to deposit the ceramic separator layer on the surface of the electrode. In one implementation, the reactive gas mixture includes at least one of oxygen-containing gas, an inert gas (e.g., argon, helium), or combinations thereof. In one implementation, the oxygen-containing gas supplied into the processing region includes at least one of oxygen ($O_2$), ozone ($O_3$), oxygen radicals (O*), ionized oxygen atoms, carbon dioxide ($CO_2$), nitric oxide ($NO_x$), water vapor, or combinations thereof. Other oxygen-containing gases may be used. In some implementations, the plasma is formed using a remote plasma source and delivered to the processing region.

In some implementations, during operation 520, a gas source supplies oxygen gas ($O_2$) through a mass flow controller to an ozonator, which converts a large fraction of the oxygen to ozone gas ($O_3$). The resultant oxygen-based mixture of $O_2$ and $O_3$ and perhaps some oxygen radicals O* and ionized oxygen atoms or molecules is delivered into the processing region. The oxygen-based gas reacts within the processing region with the surface of electrode structure, which has been heated to a predetermined, preferably low temperature. Ozone is a metastable molecule which spontaneously quickly dissociates in the reaction $O_3 \rightarrow O_2 + O^*$, where O* is a radical, which very quickly reacts with whatever available material can be oxidized. The ozonator may be implemented in a number of forms including capacitively or inductively coupled plasma or a UV lamp source.

In some implementations, where at least one edge of the positive electrode and/or the negative electrode remains exposed, it may be desirable to deposit an additional ceramic edge coating on the exposed edge to avoid shorting. The ceramic edge coating may contain the same material as the ceramic separator layer. The ceramic edge coating may be deposited using wet deposition methods (e.g., slot-die coating) followed by optional drying and/or calendaring operations. The ceramic edge coating typically has a thickness similar to the ceramic separator layer. In one implementation, the edge coating process occurs prior to operation 510. In another implementation, the edge coating process takes place after operation 520.

At operation 530, the negative electrode and the positive electrode are joined together with the ceramic separator layer therebetween to form a cell structure, for example, cell structure 100.

Figure 6:
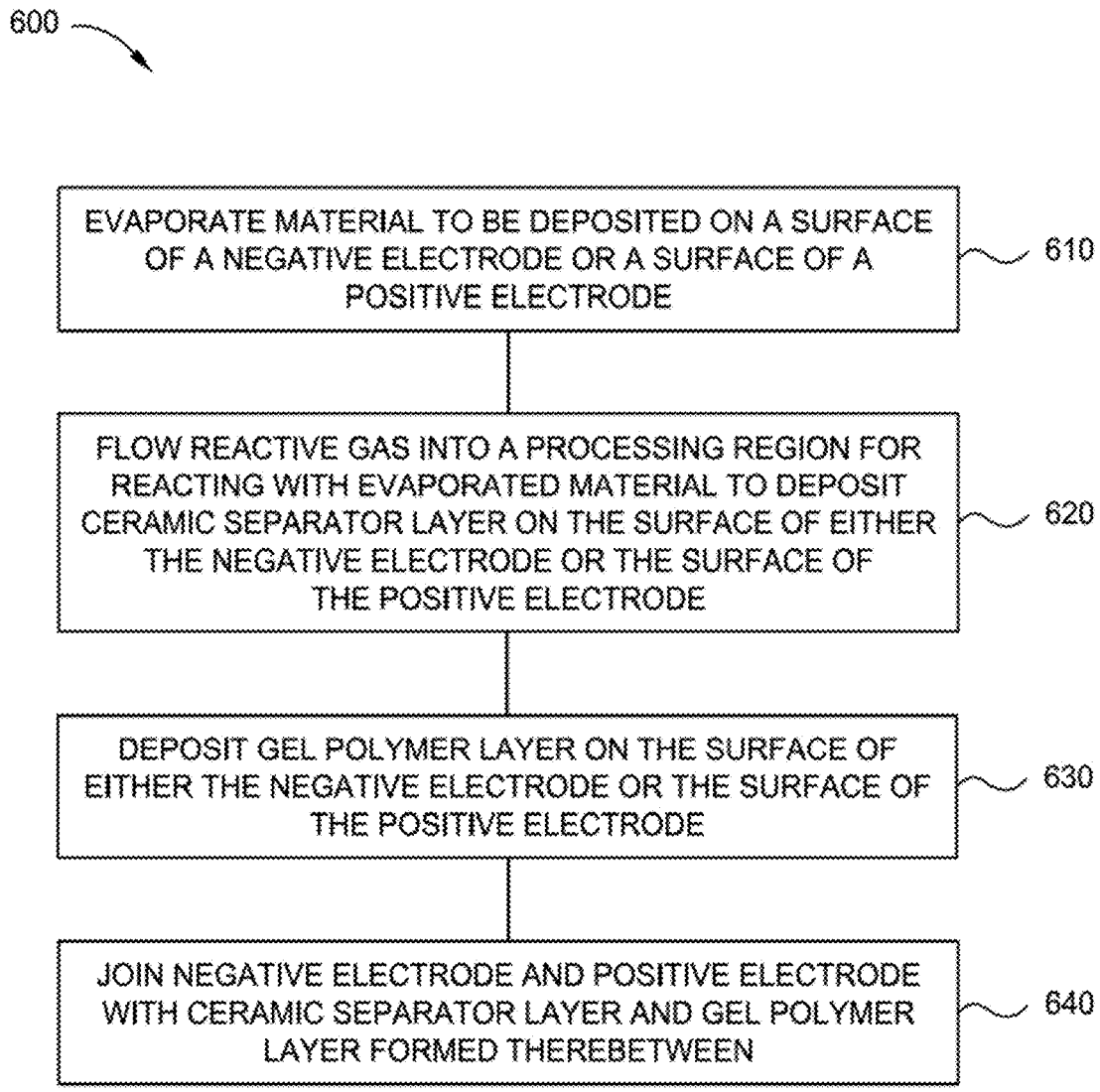
FIG. 6 illustrates a process flow chart summarizing one implementation of a method for forming an electrode structure according to one or more implementations described herein.

FIG. 6 illustrates a process flow chart summarizing one implementation of a method 600 for forming a cell structure according to one or more implementations described herein. The cell structure may be, for example, the cell structure 200 depicted in FIG. 2. Method 600 is similar to method 500 except that method 600 includes operation 630 where a gel polymer layer is deposited on the surface of either the negative electrode or the surface of the positive electrode. In some implementations, the gel polymer layer is gel polymer layer 210. In some implementations, the negative electrode is negative electrode 140 and the positive electrode is positive electrode 120. In some implementations, the ceramic separator layer 130 is deposited on a single electrode (e.g., either the negative electrode or the positive electrode) and the gel polymer layer 210 is deposited on the other electrode prior to joining the electrodes together.

At operation 610, the material to be deposited on at least one of a surface of a negative electrode and a surface of a positive electrode is exposed to an evaporation process to evaporate the material to be deposited in a processing region. Operation 610 may be performed similarly to operation 510. At operation 620, a reactive gas is flowed into the processing region for reacting with the evaporated material to form a ceramic separator layer on at least a surface of the negative electrode and a surface of the positive electrode. Operation 620 may be performed similarly to operation 520.

At operation 630, a gel polymer layer is deposited on at least one of the surface of the negative electrode and the surface of the positive electrode. The polymer for the gel polymer layer 210 can be chosen from polymers currently used in the Li-ion battery industry. Examples of polymers that may be used to form the gel polymer layer include, but are not limited to, polyvinylidene difluoride (PVDF), polyethylene oxide (PEO), poly-acrylonitrile (PAN), carboxymethyl cellulose (CMC), styrene butadiene rubber (SBR), and combinations thereof. Not to be bound by theory but it is believed that the gel polymer layer 210 can take-up Li-conducting electrolyte to form gel during device fabrication which is beneficial for forming good solid electrolyte interface (SEI) and also helps lower resistance. The gel polymer layer 210 can be formed by dip-coating, slot-die coating, gravure coating, or printing. The polymer can also be deposited using Applied Materials Metacoat equipment. The dielectric polymer layer may have a thickness from about 5 nanometers to about 1 micrometer.

At operation 640, the negative electrode and the positive electrode are joined together with the ceramic separator layer and gel polymer layer there between to form a cell structure, for example, cell structure 200.

Figure 7:
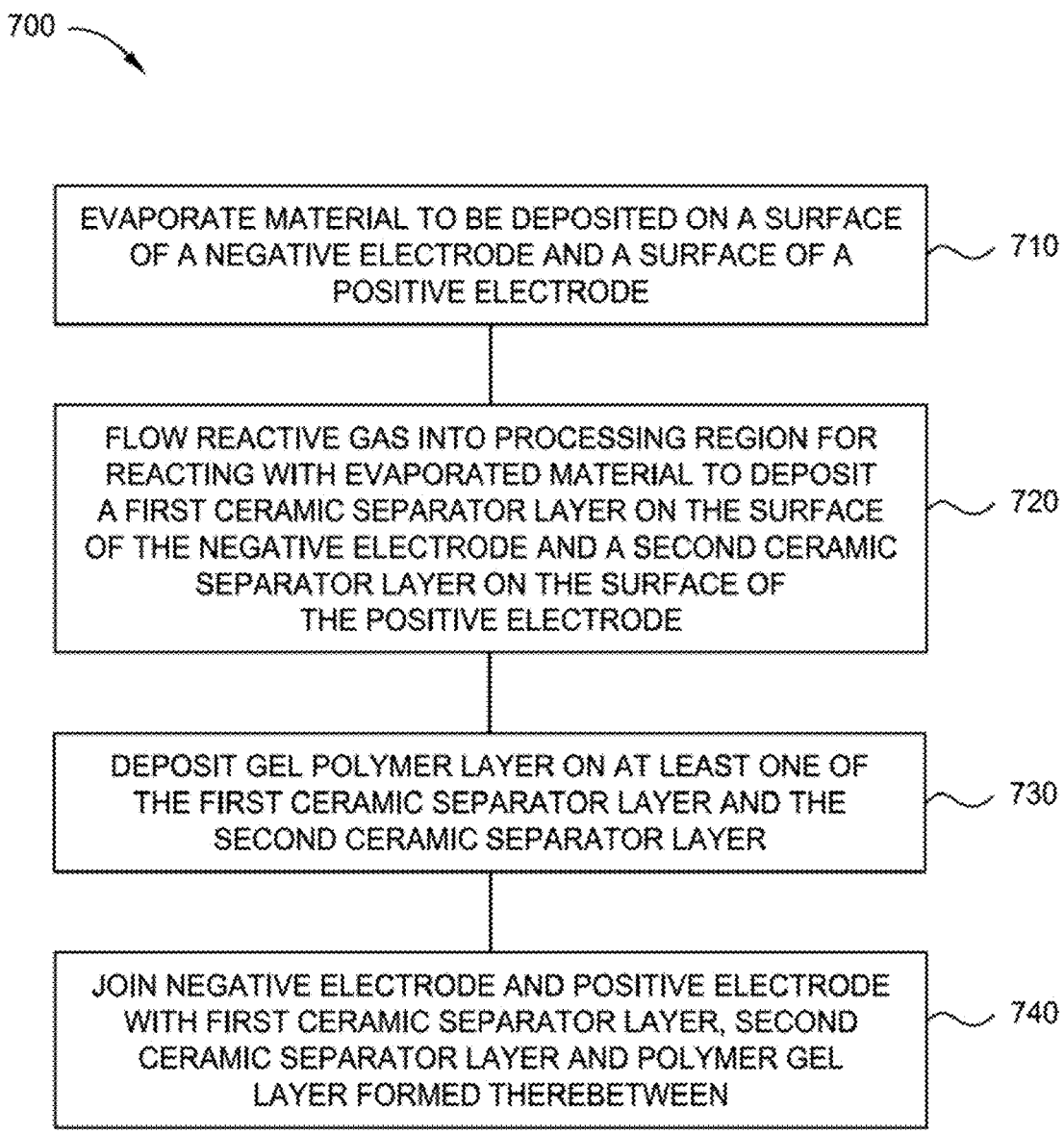
FIG. 7 illustrates a process flow chart summarizing one implementation of a method for forming an electrode structure according to one or more implementations described herein.

FIG. 7 illustrates a process flow chart summarizing one implementation of a method 700 for forming a cell structure according to one or more implementations described herein. The cell structure may be, for example, the cell structure 300 depicted in FIG. 3. Method 700 is similar to method 600 except that ceramic separator layers are deposited on both the positive electrode and the negative electrode with a gel polymer layer deposited on one of the ceramic separator layers prior to joining the negative electrode and the positive electrode together. In some implementations, the gel polymer layer is gel polymer layer 310a, the first ceramic separator layer is ceramic separator layer 330a and the second ceramic separator layer is ceramic separator layer 330b. In some implementations, the negative electrode is negative electrode 140 and the positive electrode is positive electrode 120.

At operation 710, the material to be deposited on at least one of a surface of a negative electrode and a surface of a positive electrode is exposed to an evaporation process to evaporate the material to be deposited in a processing region. Operation 710 may be performed similarly to operation 510 and operation 610. At operation 720, a reactive gas is flowed into the processing region for reacting with the evaporated material to form a first ceramic separator layer on a surface of the negative electrode and a second ceramic separator layer on a surface of the positive electrode. In some implementations, deposition on the negative electrode and the positive electrode may occur in the same processing chamber or may occur in separate processing chambers. In some implementations, deposition on the negative electrode and the positive electrode may occur sequentially or simultaneously. Operation 720 may be performed similarly to operation 520 and operation 620.

At operation 730, a gel polymer layer is deposited on at least one of the first ceramic separator layer and the second ceramic separator layer. The polymer for the gel polymer layer 310 can be chosen from polymers currently used in the Li-ion battery industry. Examples of polymers that may be used to form the gel polymer layer include, but are not limited to, polyvinylidene difluoride (PVDF), polyethylene oxide (PEO), poly-acrylonitrile (PAN), carboxymethyl cellulose (CMC), styrene butadiene rubber (SBR), and combinations thereof. The polymer can also be a liquid crystal with salt such as $Li_2O$. Not to be bound by theory but it is believed that the gel polymer layer 310 can take-up Li-conducting electrolyte to form gel during device fabrication which is beneficial for forming good solid electrolyte interface (SEI) and also helps lower resistance. The gel polymer layer 310 can be formed by dip-coating, slot-die coating, gravure coating, or printing. The polymer can also be deposited using Applied Materials Metacoat equipment. The dielectric polymer layer may have a thickness from about 5 nanometers to about 1 micrometer.

At operation 740, the negative electrode and the positive electrode are joined together with the first ceramic separator layer, the gel polymer layer, and the second ceramic separator layer there between to form a cell structure, for example, cell structure 300.

Figure 8:
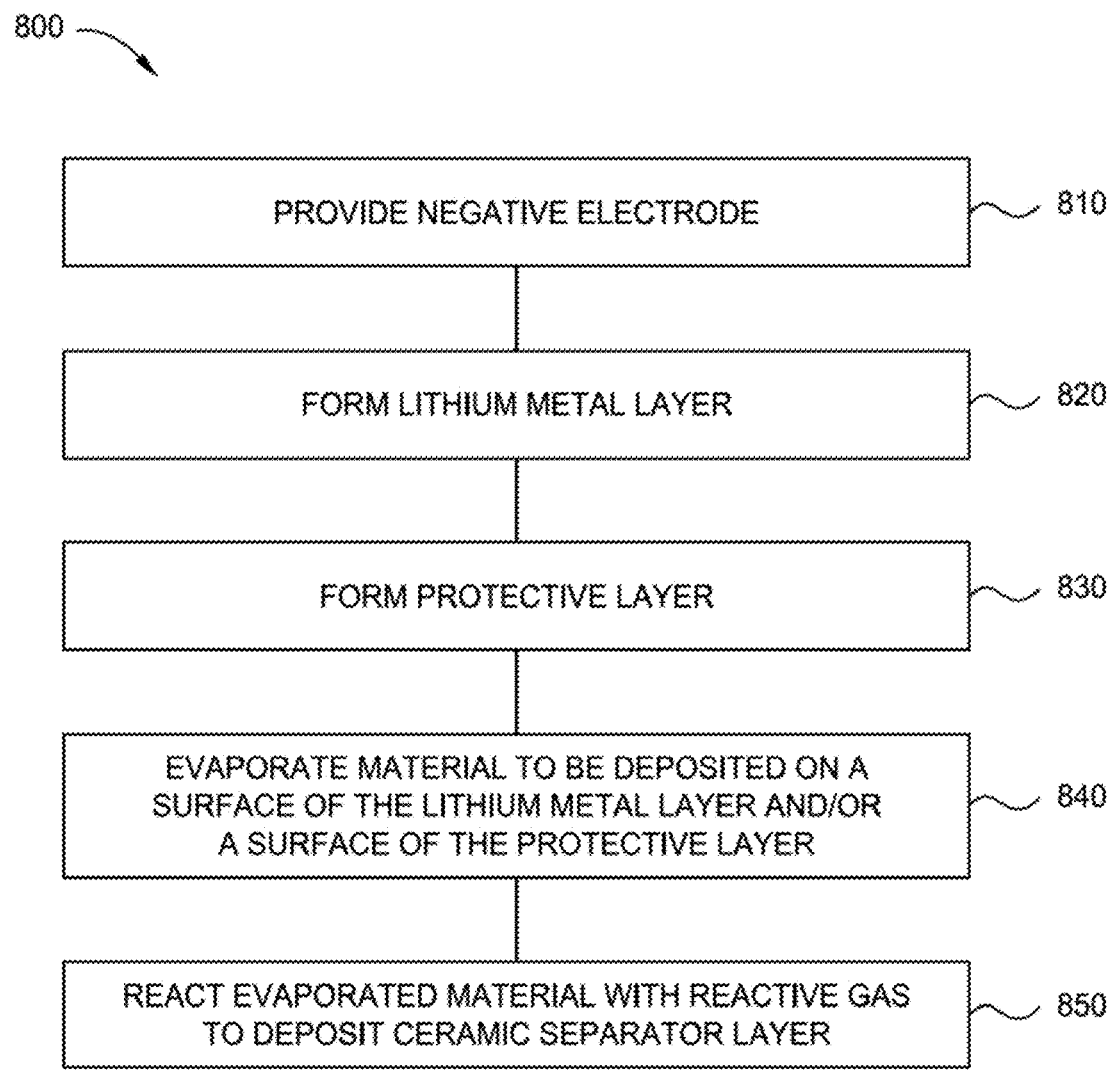
FIG. 8 illustrates a process flow chart summarizing one implementation of a method for forming an electrode structure according to one or more implementations described herein.

FIG. 8 illustrates a process flow chart summarizing one implementation of a method 800 for forming an electrode structure according to one or more implementations described herein. The cell structure may be, for example, the cell structure 400 depicted in FIG. 4. At operation 810, a negative electrode is provided. The negative electrode structure may be negative electrode 140.

At operation 820, a lithium metal layer is formed on the negative electrode. The lithium metal layer may be the pre-lithiation layer 410. In one implementation, the alkali metal film is formed on the substrate. In some implementations, if the negative electrode 140 is already present, the pre-lithiation layer 410 is formed on the negative electrode 140. If the negative electrode 140 is not present, the lithium metal film may be formed directly on the negative current collector 150. Any suitable lithium metal film deposition process for depositing thin films of lithium metal may be used to deposit the thin film of lithium metal. Deposition of the thin film of lithium metal may be by PVD processes, such as evaporation, a slot-die process, a transfer process, screen printing or a three-dimensional lithium printing process. The chamber for depositing the thin film of alkali metal may include a PVD system, such as an electron-beam evaporator, a thermal evaporator, or a sputtering system, a thin film transfer system (including large area pattern printing systems such as gravure printing systems) or a slot-die deposition system.

At operation 830, a protective layer is optionally formed on the lithium metal layer. The protective layer may be protective film 420. The protective film 420 may be a lithium fluoride film or a lithium carbonate film. In one implementation, the protective film 420 is formed via an evaporation process. The material to be deposited on the substrate is exposed to an evaporation process to evaporate the material to be deposited in a processing region. The evaporation material may be chosen from the group consisting of lithium (Li), lithium fluoride (LiF) (e.g., ultra-high pure single crystal lithium), aluminum oxide (AlOx), lithium carbonate ($Li_2CO_3$), or combinations thereof. Typically, the material to be deposited includes a metal such as lithium. Further, the evaporation material may also be an inorganic compound. The evaporation material is the material that is evaporated during the evaporation process and with which the lithium metal film is coated. The material to be deposited (e.g., lithium fluoride) can be provided in a crucible. The lithium fluoride for example, can be evaporated by thermal evaporation techniques or by electron beam evaporation techniques. This AlOx could be nm thick but can be non-porous. Under some electrochemical conditions ion conducting Li—Al—O may form.

In some implementations, the evaporation material is fed to crucible in pellet format. In some implementations, the evaporation material is fed to the crucible as a wire. In this case, the feeding rates and/or the wire diameters have to be chosen such that the sought after ratio of the evaporation material and the reactive gas is achieved. In some implementations, the diameter of the feeding wire for feeding to the crucible is chosen between 0.5 mm and 2.0 mm (e.g., between 1.0 mm and 1.5 mm). These dimensions may refer to several feedings wires made of the evaporation material. Typical feeding rates of the wire are in the range of between 50 cm/min and 150 cm/min (e.g., between 70 cm/min and 100 cm/min).

The crucible is heated in order to generate a vapor to coat the lithium metal film with the protective film. Typically, the crucible is heated by applying a voltage to the electrodes of the crucible, which are positioned at opposite sides of the crucible. Generally, according to implementations described herein, the material of the crucible is conductive. Typically, the material used as crucible material is temperature resistant to the temperatures used for melting and evaporating. Typically, the crucible of the present disclosure is made of one or more materials selected from the group consisting of metallic boride, metallic nitride, metallic carbide, non-metallic boride, non-metallic nitride, non-metallic carbide, nitrides, titanium nitride, borides, graphite, tungsten, $TiB_2$, BN, $B_4C$, and SiC.

The material to be deposited is melted and evaporated by heating the evaporation crucible. Heating can be conducted by providing a power source (not shown) connected to the first electrical connection and the second electrical connection of the crucible. For instance, these electrical connections may be electrodes made of copper or an alloy thereof. Thus, heating is conducted by the current flowing through the body of the crucible. According to other implementations, heating may also be conducted by an irradiation heater of an evaporation apparatus or an inductive heating unit of an evaporation apparatus.

The evaporation unit according to the present disclosure is typically heatable to a temperature of between 800 degrees Celsius and 1200 degrees Celsius, such as 845 degrees Celsius. This is done by adjusting the current through the crucible accordingly, or by adjusting the irradiation accordingly. Typically, the crucible material is chosen such that its stability is not negatively affected by temperatures of that range. Typically, the speed of the porous polymeric substrate is in the range of between 20 cm/min and 200 cm/min, more typically between 80 cm/min and 120 cm/min such as 100 cm/min. In these cases, the means for transporting should be capable of transporting the substrate at those speeds.

At operation 840, the material to be deposited on at least one of a surface of the lithium metal layer and/or a surface of the protective layer is exposed to an evaporation process to evaporate the material to be deposited in a processing region. Operation 810 may be performed similarly to operation 510, operation 610, and operation 710. At operation 850, a reactive gas is flowed into the processing region for reacting with the evaporated material to form a ceramic separator layer on at least one of a surface of the lithium metal layer and/or a surface of the protective layer. The ceramic separator layer may be ceramic separator layer 430*a*. In some implementations, deposition on the negative electrode and the positive electrode may occur in the same processing chamber or may occur in separate processing chambers. In some implementations, deposition on the negative electrode and the positive electrode may occur sequentially or simultaneously. Operation 720 may be performed similarly to operation 520 and operation 620.

Optionally a gel polymer layer is formed on the ceramic separator layer. The gel polymer layer may be gel polymer layer 440 and may be formed similarly to gel polymer layer 310 described at operation 730. The polymer for the gel polymer layer 440 can be chosen from polymers currently used in the Li-ion battery industry. Examples of polymers that may be used to form the gel polymer layer include, but are not limited to, polyvinylidene difluoride (PVDF), polyethylene oxide (PEO), poly-acrylonitrile (PAN), carboxymethyl cellulose (CMC), styrene butadiene rubber (SBR), and combinations thereof. Not to be bound by theory but it is believed that the gel polymer layer 440 can take-up Li-conducting electrolyte to form gel during device fabrication which is beneficial for forming good solid electrolyte interface (SEI) and also helps lower resistance. The gel polymer layer 440 can be formed by dip-coating, slot-die coating, gravure coating, or printing. The polymer can also be deposited using Applied Materials Metacoat equipment. The dielectric polymer layer may have a thickness from about 5 nanometers to about 1 micrometer.

The negative electrode and the positive electrode are joined together with the ceramic separator layer 430*a*, the gel polymer layer 440*a*, and the ceramic separator layer 430*b* there between to form a cell structure, for example, cell structure 400.

Figure 9:
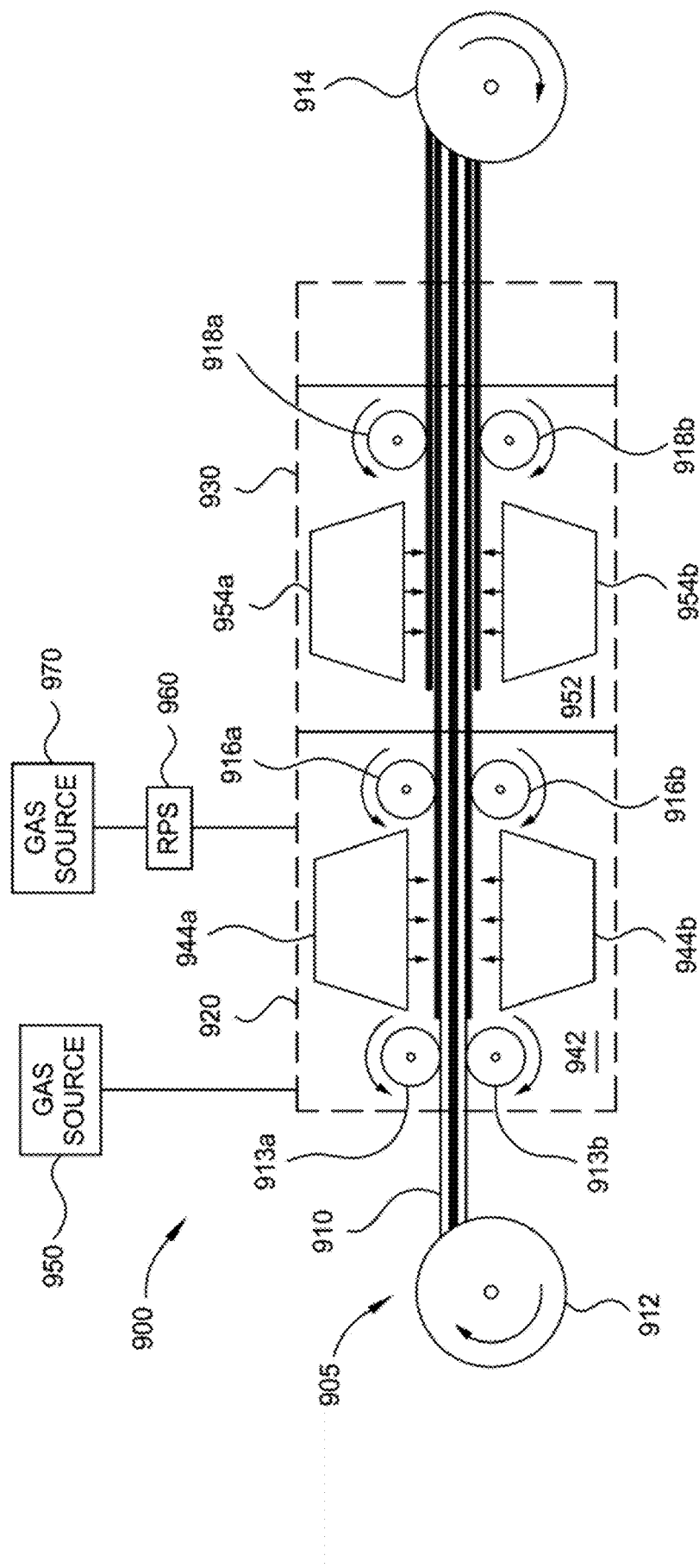
FIG. 9 illustrates a schematic view of a web tool for forming a ceramic separator according to one or more implementations described herein.
Figure 10:
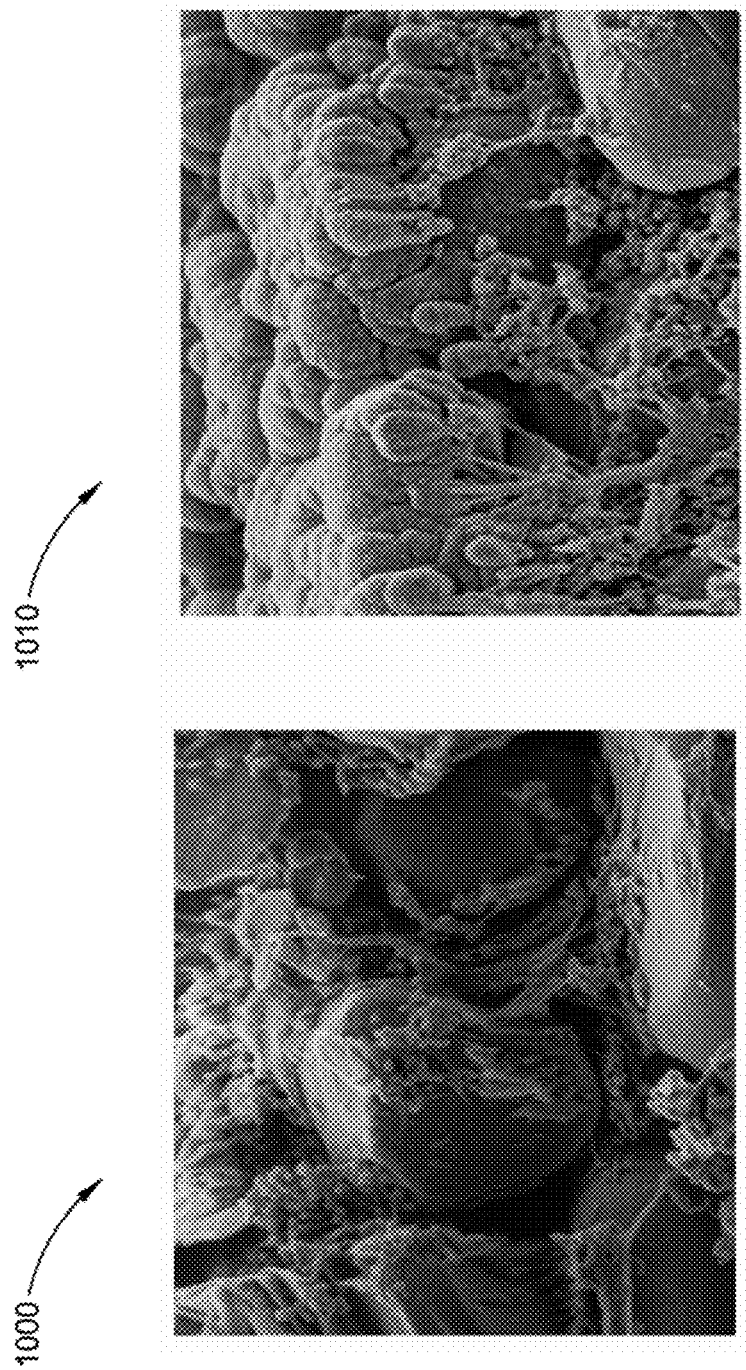
FIG. 10A illustrates a scanning electron microscope (SEM) image of uncoated cathode material.
FIG. 10B illustrates an SEM image of cathode material coated with aluminum oxide according to implementations described herein.

FIG. 9 illustrates a schematic view of an integrated processing tool 900 for forming a ceramic separator according to one or more implementations described herein. In certain implementations, the integrated processing tool 900 comprises a plurality of processing modules or chambers 920 and 930 arranged in a line, each configured to perform one processing operation to a continuous sheet of material 910. In one implementation, the processing chambers 920 and 930 are stand-alone modular processing chambers wherein each modular processing chamber is structurally separated from the other modular processing chambers. Therefore, each of the stand-alone modular processing chambers, can be arranged, rearranged, replaced, or maintained independently without affecting each other. In certain implementations, the processing chambers 920 and 930 are configured to process both sides of the continuous sheet of material 910. Although the integrated processing tool 900 is configured to process a vertically oriented continuous sheet of material 910, the integrated processing tool 900 may be configured to process substrates positioned in different orientations, for example, a horizontally oriented continuous sheet of material 910. In certain implementations, the continuous sheet of material 910 is a flexible conductive substrate.

In certain implementations, the integrated processing tool 900 comprises a transfer mechanism 905. The transfer mechanism 905 may comprise any transfer mechanism capable of moving the continuous sheet of material 910 through the processing region of the processing chambers 920 and 930. The transfer mechanism 905 may comprise a common transport architecture. The common transport architecture may comprise a reel-to-reel system with a take-up reel 914 and a feed reel 912 for the system. The take-up reel 914 and the feed reel 912 may be individually heated. The take-up reel 914 and the feed reel 912 may be individually heated using an internal heat source positioned within each reel or an external heat source. The common transport architecture may further comprise one or more intermediate transfer reels (913a & 913b, 916a & 916b, 918a & 918b) positioned between the take-up reel 914 and the feed reel 912. Although the integrated processing tool 900 is depicted as having a single processing region, in certain implementations, it may be advantageous to have separate or discrete processing regions, modules, or chambers for each process. For implementations having discrete processing regions, modules, or chambers, the common transport architecture may be a reel-to-reel system where each chamber or processing region has an individual take-up-reel and feed reel and one or more optional intermediate transfer reels positioned between the take-up reel and the feed reel. The common transport architecture may comprise a track system. The track system extends through the processing regions or discrete processing regions. The track system is configured to transport either a web substrate or discrete substrates.

The integrated processing tool 900 may comprise the feed reel 912 and the take-up reel 914 for moving the continuous sheet of material 910 through the different processing chambers. The different processing chamber may include a first processing chamber 920 for deposition of a ceramic separator film and a second processing chamber 930 for deposition of a gel polymer layer over the ceramic separator film. In some implementations, the finished electrode will not be collected on the take-up reel 914 as shown in the figures, but may go directly for integration with the separator and positive electrodes, etc., to form battery cells.

The first processing chamber 920 is configured for depositing a ceramic separator film on the continuous sheet of material 910. In one implementation, the first processing chamber 920 is an evaporation chamber. The evaporation chamber has a processing region 942 that is shown to comprise an evaporation source 944a, 944b (collectively 944) that may be placed in a crucible, which may be a thermal evaporator or an electron beam evaporator (cold) in a vacuum environment, for example. A first gas source 950 for supplying reactive gas to the processing region 942 is coupled with the processing region 942. A remote plasma source 960 is coupled with the processing region for supplying plasma to the processing region. The remote plasma source 960 may be coupled with a second gas source 970.

The second processing chamber 930 is configured for depositing a gel polymer layer over the sheet of material (e.g., on the ceramic separator film. The gel polymer layer may be an ion conducting material as described herein. The gel polymer layer can be formed by dip-coating, slot-die coating, gravure coating, laminating, or printing.

In one implementation, the second processing chamber 930 is a three-dimensional printing chamber. The printing chamber has a processing region 952 that is shown to comprise a printing source 954a, 954b (collectively 954) for printing a polymer ink.

In one implementation, the processing region 942 and the processing region 952 remain under vacuum and/or at a pressure below atmosphere during processing. The vacuum level of processing region 942 may be adjusted to match the vacuum level of the processing region 952. In one implementation, the processing region 942 and the processing region 952 remain at atmospheric pressure during processing. In one implementation, the processing region 942 and the processing region 952 remain under an inert gas atmosphere during processing. In one implementation, the inert gas atmosphere is an argon gas atmosphere. In one implementation, the inert gas atmosphere is a nitrogen gas ($N_2$) atmosphere.

Additional chambers may be included in the integrated processing tool 900. In some implementations, additional chambers may provide for deposition of an electrolyte soluble binder, or in some implementations, additional chambers may provide for formation of electrode material (positive or negative electrode material). In some implementations, additional chambers provide for cutting of the electrode.

FIG. 10A illustrates a scanning electron microscope (SEM) image 1000 of uncoated cathode material. FIG. 10B illustrates an SEM image 1010 of cathode material coated with aluminum oxide according to implementations described herein.

Figure 11:
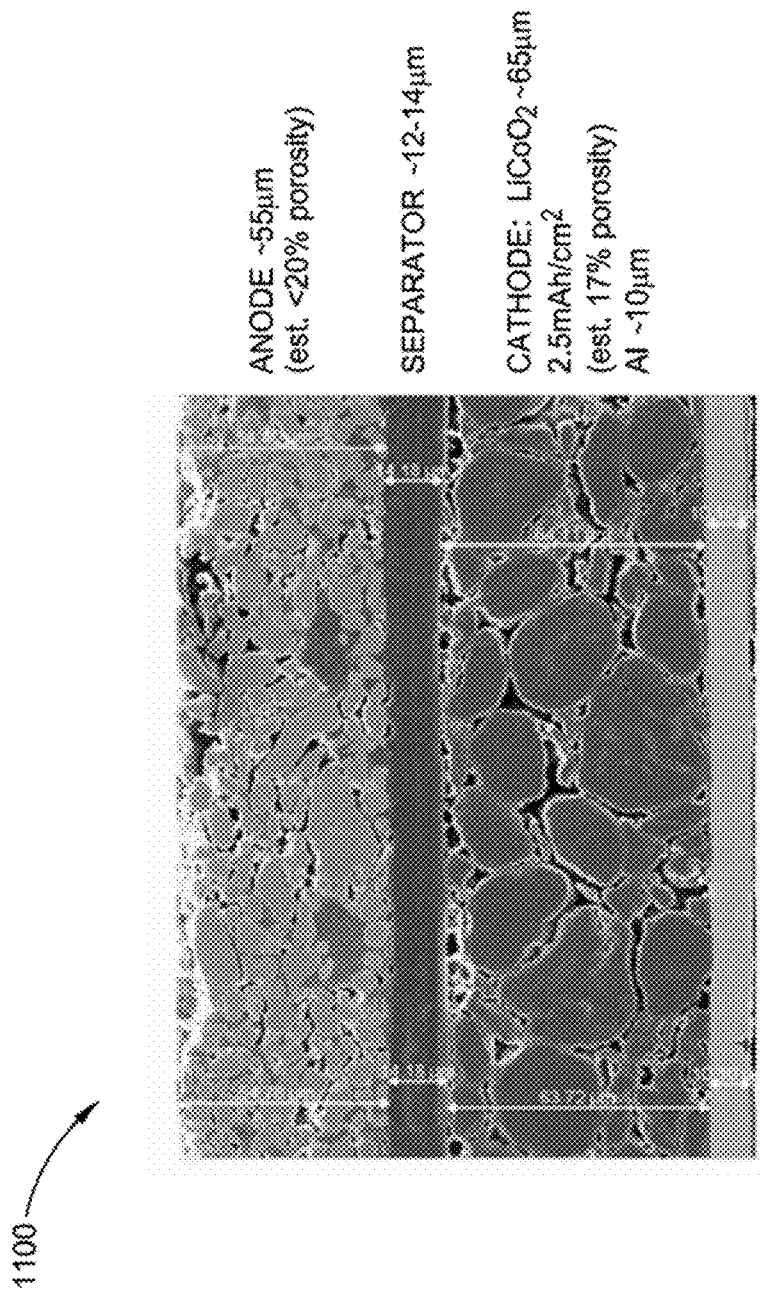
FIG. 11 illustrates an SEM image of a schematic cross-sectional view of a cell structure having a ceramic separator layer formed according to implementations described herein.

FIG. 11 illustrates an SEM image of a schematic cross-sectional view of a cell structure 1100 having a ceramic separator layer formed according to implementations described herein. The cell structure 1100 includes a ceramic separator layer positioned between a negative electrode and a positive electrode. The negative electrode has a thickness of about 55 μm and an estimated porosity of less than 20%. The positive electrode (e.g., $LiCoO_2$) has a thickness of about 65 μm and an estimated porosity of about 17%. The ceramic separator layer has a thickness of about 12 to 14 μm.

In summary, some of the benefits of the present disclosure include the efficient deposition of ceramic separator material directly onto electrode material. The ability to deposit ceramic separator material directly onto electrode material eliminates the need for polyolefin separators. Elimination of the polyolefin separator reduces the likelihood of thermal shrinkage while decreasing the distance between the positive electrode and the negative electrode. For example, in some implementations the ceramic separator layer formed according to implementations described herein has a thickness of 3 μm or less in comparison with a polyolefin separate, which typically has a thickness of about 20 μm or more. In addition, the dry coating techniques described herein do not suffer from several of the drawbacks that wet coating techniques suffer from. For example, wet coating techniques include solvents, which are often adsorbed into the underlying electrode structure, which adds an extra drying operation to the overall process. Further, in some implementations described herein, the process of ceramic separator layer deposition is a vacuum coating process, which removes residual moisture from the electrode structure without adding an additional drying component to the deposition process and the processing tool.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to implementations of the present disclosure, other and further implementations of the present disclosure may be devised without departing from the basic scope thereof, and the scope thereof is determined by the claims that follow.

The invention claimed is:

1. A method of forming a separator for a battery, comprising:
    exposing a metallic material to be deposited on a surface of an electrode structure positioned in a processing region to an evaporation process to form an evaporated metallic material;
    flowing a reactive gas into the processing region, comprising:
        exposing oxygen to water vapor to form moist oxygen; and
        introducing the moist oxygen into the processing region; and
    reacting the reactive gas and the evaporated metallic material to deposit a ceramic separator layer on the surface of the electrode structure.

2. The method of claim 1, wherein the metallic material is selected from the group consisting of: aluminum (Al), silver (Ag), chromium (Cr), copper (Cu), indium (In), iron (Fe), magnesium (Mg), nickel (Ni), tin (Sn), ytterbium (Yb), or combinations thereof.

3. The method of claim 1, wherein the ceramic separator layer is an aluminum hydroxide oxide layer.

4. The method of claim 1, wherein the evaporation process is a thermal evaporation process or an electron beam evaporation process.

5. The method of claim 1, wherein the evaporation process comprises exposing the metallic material to a temperature of between 1,300 degrees Celsius and 1,600 degrees Celsius.

6. The method of claim 1, wherein the ceramic separator layer is a binder-free ceramic layer.

7. The method of claim 1, wherein the ceramic separator layer has a thickness in the range of 1 nanometer to 3,000 nanometers.

8. The method of claim 7, wherein the ceramic separator layer has a thickness in the range of 10 nanometers to 500 nanometers.

9. The method of claim 1, wherein the ceramic separator layer comprises boehmite.

10. The method of claim 1, further comprising:
    depositing a ceramic edge coating on an edge of the electrode structure using a wet coating technique.

11. The method of claim 10, wherein depositing the ceramic edge coating occurs prior to exposing the metallic material to be deposited on the surface of the electrode structure.

12. The method of claim 10, wherein depositing the ceramic edge coating occurs after depositing the ceramic separator layer on the surface of the electrode structure.

13. The method of claim 1, wherein the electrode structure is a negative electrode.

14. The method of claim 1, wherein the electrode structure is a positive electrode.

15. The method of claim 1, further comprising depositing a gel polymer layer on the ceramic separator layer.

16. A method of forming a battery, comprising:
    depositing a ceramic separator layer on a surface of a negative electrode structure, comprising:
        exposing a metallic material to be deposited on the surface of the negative electrode structure positioned in a processing region to an evaporation process to form an evaporated metallic material;
        flowing a reactive gas into the processing region, comprising:
            exposing oxygen to water vapor to form moist oxygen; and
            introducing the moist oxygen into the processing region; and
        reacting the reactive gas and the evaporated metallic material to deposit the ceramic separator layer on the surface of the negative electrode structure; and
    joining the negative electrode structure with a positive electrode structure with the ceramic separator layer therebetween.

17. The method of claim 16, wherein the ceramic separator layer is an aluminum hydroxide oxide layer.

18. The method of claim 16, wherein the evaporation process is a thermal evaporation process or an electron beam evaporation process.

19. A method of forming a battery, comprising:
    depositing a ceramic separator layer on a surface of a positive electrode structure, comprising:
        exposing a metallic material to be deposited on the surface of the positive electrode structure positioned in a processing region to an evaporation process to form an evaporated metallic material;
        flowing a reactive gas into the processing region, comprising:
            exposing oxygen to water vapor to form moist oxygen; and
            introducing the moist oxygen into the processing region;
        reacting the reactive gas and the evaporated metallic material to deposit the ceramic separator layer on the surface of the positive electrode structure; and
    joining the positive electrode structure with a negative electrode structure with the ceramic separator layer therebetween.

20. The method of claim 19, wherein the ceramic separator layer is an aluminum hydroxide oxide layer.

* * * * *